(12) United States Patent
Rickard et al.

(10) Patent No.: US 10,700,046 B2
(45) Date of Patent: Jun. 30, 2020

(54) MULTI-CHIP HYBRID SYSTEM-IN-PACKAGE FOR PROVIDING INTEROPERABILITY AND OTHER ENHANCED FEATURES TO HIGH COMPLEXITY INTEGRATED CIRCUITS

(71) Applicant: BAE Systems Information and Electronic Systems Integration Inc., Nashua, NH (US)

(72) Inventors: Dale A Rickard, Manassas, VA (US); Jason F Ross, Haymarket, VA (US); John T Matta, Nokesville, VA (US); Richard J Ferguson, Bealeton, VA (US); Alan F Dennis, Chantilly, VA (US); Joseph R Marshall, Jr., Manassas, VA (US); Daniel L Stanley, Warrenton, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 16/057,204

(22) Filed: Aug. 7, 2018

(65) Prior Publication Data
US 2020/0051961 A1    Feb. 13, 2020

(51) Int. Cl.
*H01L 25/16*     (2006.01)
*H01L 23/498*    (2006.01)
(Continued)

(52) U.S. Cl.
CPC ........ *H01L 25/16* (2013.01); *H01L 23/49811* (2013.01); *H01L 23/49822* (2013.01);
(Continued)

(58) Field of Classification Search
None
See application file for complete search history.

(56) References Cited

U.S. PATENT DOCUMENTS 4,130,892 A    12/1978    Gunkel, II et al.
5,438,437 A     8/1995    Mizoguchi et al.
(Continued)

FOREIGN PATENT DOCUMENTS

EP    0432846 A1    6/1991
WO    2008118553 A2   10/2008
WO    2008140643 A2   11/2008

OTHER PUBLICATIONS

Lapedus; Mark, The Chiplet Race Begins, Semiconductor Engineering, Aug. 6, 2018, https://semiengineering.com/the-chiplet-race-begins/, 13 pages.
(Continued)

*Primary Examiner* — Thien F Tran
(74) *Attorney, Agent, or Firm* — Maine Cernota & Rardin; Scott J. Asmus

(57) ABSTRACT

An MCM-HIC device flexibly adds enhanced features to a VLSI "core" IC that are not directly supported by the core IC, such as unsupported communication protocols and/or support of cold spare operation. The core IC is mounted on an interconnecting substrate together with at least one "chiplet" that provides the required feature(s). The chiplet can be programmable. The chiplet can straddle a boundary of an interposer region of the substrate that provides higher density interconnections at lower currents. The disclosed method can include selecting a core IC and at least one active, passive, or "mixed" chiplet, configuring a substrate, and installing the core IC and chiplet(s) on the substrate. In embodiments, the core IC and/or chiplet(s) can be modified before assembly to obtain the desired result. Cost can be reduced by pre-designing and, in embodiments, pre-manufacturing the chiplets and modified core ICs in cost-effective quantities.

21 Claims, 21 Drawing Sheets

(51) Int. Cl.
*H01L 23/00* (2006.01)
*H01L 25/00* (2006.01)
*H01L 27/112* (2006.01)
*H01L 23/42* (2006.01)
*H01L 23/367* (2006.01)

(52) U.S. Cl.
CPC .............. *H01L 24/16* (2013.01); *H01L 25/50* (2013.01); *H01L 27/11206* (2013.01); *H01L 23/367* (2013.01); *H01L 23/42* (2013.01); *H01L 2224/16225* (2013.01)

(56) References Cited

U.S. PATENT DOCUMENTS

| | | |
|---|---|---|
| 6,111,780 A | 8/2000 | Bertin |
| 6,142,358 A | 11/2000 | Cohn et al. |
| 7,408,410 B2 | 8/2008 | Wood |
| 8,778,755 B2 | 7/2014 | Ross |
| 8,975,920 B2 | 3/2015 | Bansal |
| 2002/0024098 A1 | 2/2002 | Eimori |
| 2003/0020160 A1* | 1/2003 | Deeney ................ H01L 23/367 257/706 |
| 2007/0023878 A1 | 2/2007 | Burton |
| 2007/0285851 A1 | 12/2007 | Hillman |
| 2009/0189639 A1 | 7/2009 | Wingen |
| 2010/0039030 A1* | 2/2010 | Winters .............. H01L 27/3248 313/505 |
| 2010/0109166 A1 | 5/2010 | Cok et al. |
| 2011/0034912 A1 | 2/2011 | De Graff et al. |
| 2012/0191403 A1 | 7/2012 | Geukes et al. |
| 2012/0212465 A1* | 8/2012 | White .................. G09G 3/2085 345/205 |
| 2012/0317528 A1 | 12/2012 | Mcilrath et al. |
| 2017/0025075 A1 | 1/2017 | Cok et al. |
| 2017/0200672 A1 | 7/2017 | Jayasena et al. |
| 2019/0221556 A1* | 7/2019 | Gomes ................ H01L 23/481 |

OTHER PUBLICATIONS

Mutschlir; Ann Steffora, DARPA CHIPS Program Pushes for Chiplets, Semiconductor Engineering, Sep. 14, 2017, https://semiengineering.com/darpa-chips-program-pushes-for-chiplets/, 6 pages.
International Search Report, PCT/US2019/043245, dated Oct. 10, 2019, 11 pages.
European Search Report for Appl No. EP08794298 dated Oct. 25, 2010, 2 pages.
European Search Report for Appl No. EP08780420 dated Oct. 27, 2010, 4 pages.

* cited by examiner

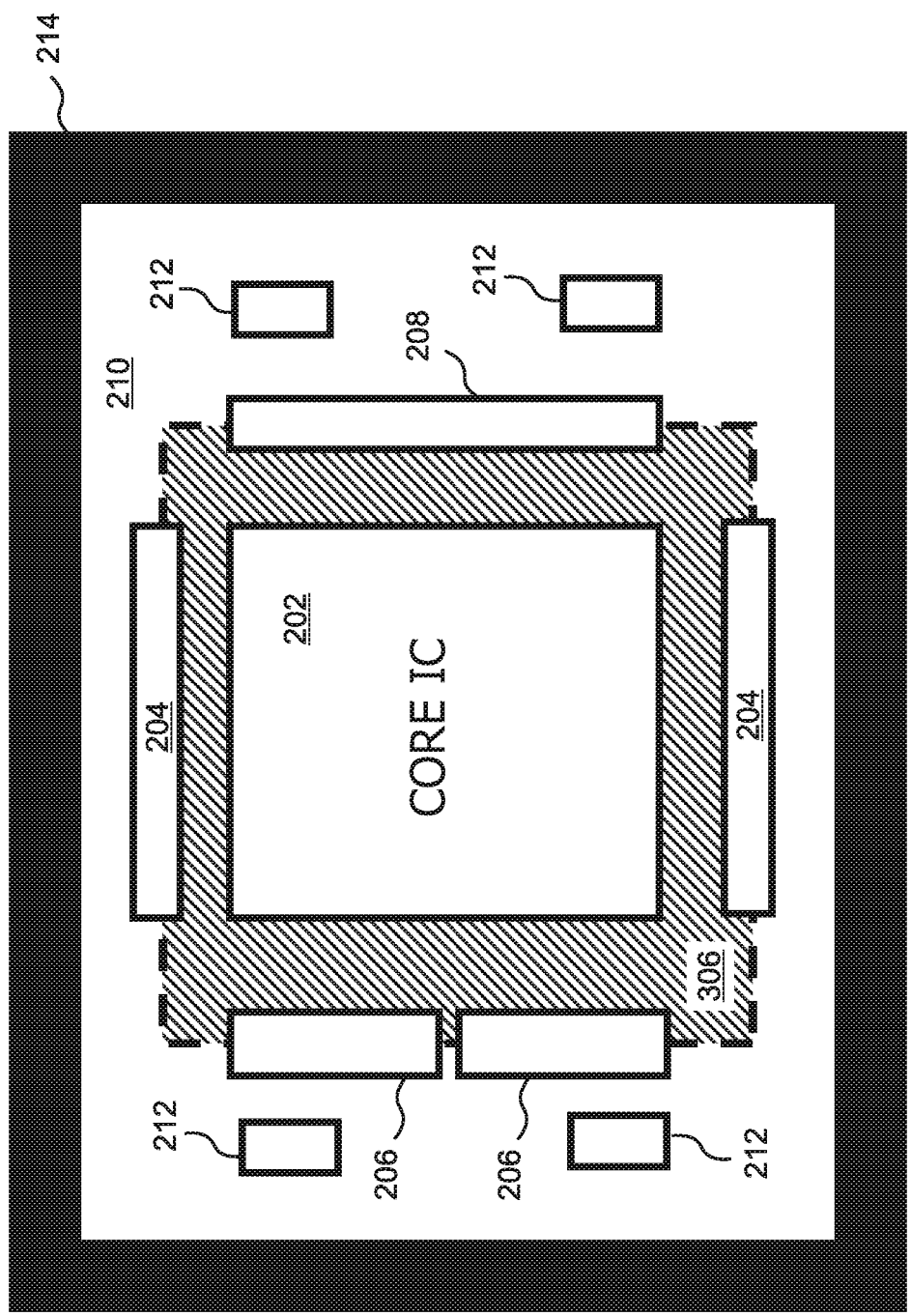

MULTI-CHIP HYBRID SYSTEM-IN-PACKAGE FOR PROVIDING INTEROPERABILITY AND OTHER ENHANCED FEATURES TO HIGH COMPLEXITY INTEGRATED CIRCUITS

FIELD

The present disclosure relates to integrated circuits, and more particularly, to apparatus and methods for providing interoperability and other enhanced features to high complexity VLSI integrated circuits.

BACKGROUND

Advances in the technology of integrated circuit ("IC") production, including increases in lithography resolution to below 100 nm, has resulted in the availability of very high complexity, compact ICs, referred to herein generically as "very large scale integration" or "VLSI" ICs, that provide complex and sophisticated performance, often with enhanced speed and reduced power consumption. Furthermore, due to mass production, many VLSI ICs have become very economical, such that they can provide attractive solutions for a wide range of applications.

Many VLSI ICs are produced at very high resolutions and with very thin transistor gate oxide, so that they operate at low voltages, typically below 1.5V, with reduced power consumption and increased speed. For example, CMOS devices are currently available with resolutions of 14 nm or even 7 nm or less that operate at 0.8V or lower internal voltage.

So as to reduce size and power consumption, many of these VLSI ICs tend to be somewhat specialized in their designs, and include only the features that are required to address their intended applications. For example, many VLSI ICs include input/output (I/O) interfaces that are compatible with only one, or only a few, communication standards. As ICs have become denser and more specialized, different communication protocols have been adopted having signaling and control protocols that are optimized for different applications. Generally, a VLSI IC will be configured only for compatibility with the communication standard(s) that are most commonly in use in the applications that the VLSI IC is most likely to be implemented.

Because modern VLSI ICs provide many advantages in terms of high speed, high density, low power consumption, etc., and because the cost of VLSI ICs is greatly reduced when they can be produced in large quantities, it can be desirable to implement a given VLSI IC design for as many different applications as possible, which can include incorporating existing VLSI IC designs into applications that may not have been foreseen by the designers of the VLSI IC, such as when upgrading legacy apparatus and designs, or designing systems for exotic applications such as deployment in space.

Unfortunately, the limited I/O compatibility and other specialized features of many VLSI ICs can render them difficult or impossible to implement in niche applications such as upgrading legacy technology, or in any circumstances where a communication protocol or other enhanced feature is required that is not supported by the VLSI IC.

In particular, difficulties can arise when interoperability is desired between a low voltage VLSI IC and legacy technologies that communicate using higher voltage protocols, such as PCI (3.3V), SpaceWire (LVDS), I²C (typically 3.3V or 5V open drain), SPI (typically 1.8V or 3.3V), general purpose I/O (typically 5V CMOS or 3.3V LVCMOS), and legacy memory (FLASH, PROM, SRAM, and SDRAM) interfaces (typically 2.5V or 3.3V) or specialized I/O interfaces such as PECL and GTL. For instance, a 1.2V LVCMOS low voltage IC may require conversion to 3.3V LVCMOS or to LVDS.

Due to the thinner gate oxides of most sub-100 nm devices, the individual transistors included in many VLSI ICs simply cannot tolerate the higher voltages at which many legacy communication protocols such as PCI and SPI operate. Furthermore, modern VLSI devices often lack the full complement of output logic and the output current support, or "fan-out," that is required by these legacy communication standards.

One approach is to include within the same CMOS or other VLSI IC both thin gate oxide transistors, optimized for internal circuits, and thicker gate oxide transistors, optimized for supporting input/output (I/O) circuits at higher voltages. However, this approach increases the integrated circuit manufacturing complexity and cost, typically limiting the thick oxide devices to twice the gate oxide thickness of the internal transistors. As a result, such "dual oxide" I/O transistors typically support interface voltages of only approximately twice the internal transistors, limiting I/O circuits to less than 2 Volts for ICs with less than 1 Volt internal power supply.

Another approach that can provide limited support for legacy communication standards is to configure I/O circuits within the VLSI IC that can tolerate higher voltages by stacking a plurality of transistors and providing a plurality of bias voltages from the power bus, so that no single transistor in the stack is subject to the full output voltage. A typical prior art example is illustrated in FIG. 1. By generating such "protection" voltages, as illustrated, this approach can allow a stacked-transistor I/O circuit to reliably operate at a voltage that is higher than what a single transistor can tolerate.

However, the approach illustrated in FIG. 1 is also typically limited to interfaces that operate at voltages less than twice the breakdown voltage of the I/O transistors, due to the increased complexity of stacking transistors. Also, I/O circuits such as that of FIG. 1, when operating near the breakdown limit of the transistor stack, cannot be used to provide "off-card" signals, i.e. signals that are transmitted beyond the immediate printed circuit board, because the thin gate oxides of the IC transistors are unable to support the large over-shoot and under-shoot voltages that would result on the input/output pins of the IC, due to the longer conduction lengths, as well as transmission line discontinuities caused by the corresponding connector interfaces.

Interoperability challenges when implementing VLSI ICs can also arise when there are differences in output current requirements ("fan-out"), and/or differences in signaling and control requirements. For example, a VLSI IC that offers reduced size and power consumption may support only minimal I/O output current and/or complexity, such that it is suitable for some applications, but not with other applications that require interoperability with a communication protocol that requires higher output current and/or more complex signaling and control. For example, a short-run Serializer/Deserializer ("SerDes") interface at the low voltage IC level may require conversion to a long-run SerDes.

Another enhanced feature that is required by some niche applications is redundant "cold spare operation," which is critical for high reliability applications such as space applications, and which the approach of FIG. 1 cannot support. In cold spare operation, unpowered, standby, redundant ICs interface with active devices that may drive their I/O, even when the standby ICs are not powered. The cold spare ICs must survive in this condition, perhaps for many years, before possibly being powered-up to replace a failed device. Additional information regarding cold spare operation can be found for example in U.S. Pat. No. 7,239,177, and in U.S. Pat. No. 5,117,129, both of which are incorporated herein by reference for all purposes.

The approach of FIG. 1 cannot support cold spare operation because, when the higher voltage I/O circuits of the standby ICs are not powered, the bias circuits are inoperative and are thus unable to generate the bias (i.e. "protection") voltages required for reliable operation. In the absence of these "protection" voltages, the approach of FIG. 1 would be limited to the voltage that a single transistor can reliably tolerate in "cold spare" operation. More importantly, if an elevated voltage were applied to an I/O circuit using the approach of FIG. 1 while in "cold spare" operation, catastrophic device failure would quickly occur, due to the voltage overstress condition created on the thin-gate oxides of the I/O circuit transistors.

Even when designing new VLSI ICs, it can be difficult to include sufficient I/O compatibility and other features in the IC to enable its use in a wide variety of applications, without unduly increasing the size, complexity, and power consumption of the IC.

One approach to providing high density ICs that are more flexible and less specialized is the multi-function "System on a Chip" or "SoC" approach. These complex SoC designs enable a single IC to support many use applications and therefore greatly reduce the need to develop derivative ICs, by providing a large number of functions on a single IC and allowing each application to select which of the available functions will be used.

Another approach to providing high density ICs that are more flexible and less specialized is the multi-function "Field Programmable Gate Array" or "FPGA" approach. FPGAs are personalized by programming configurable circuits according to individual application requirements.

Of course, a significant disadvantage of these approaches is that the power that is supplied to unused portions of the FPGA or SoC is wasted. In applications where large portions of the FPGA or SoC design are utilized, the adverse impacts of power consumed by unused portions of the FPGA or SoC are somewhat minimized. However, in other applications where only small portions of the FPGA or SoC design are utilized, the adverse impact of power consumed by unused portions of the FPGA or SoC is maximized.

One approach is to incorporate power management features into the system to optimize the power consumption of each use application. For example, on-die power gating is often included in portable electronics to enable dynamic power control of functions within the SoC by supplying power only to those circuits of the SoC that are required for a given application. However, while on-die power gating is an effective method for reducing power consumption within a SoC, it can be challenging to implement in advanced technology nodes due to long-term reliability challenges, for example related to thermal management (hot spots) and wire wear out (electromigration). These long-term reliability challenges are even more problematic in space applications, due to prolonged mission durations, elevated operating temperatures and limited thermal management options.

An approach that can address almost any type of communication incompatibility and/or lack of other desired VLSI features is to provide intervening circuitry, referred to herein generically as an interface IC, or sometimes generically as a "buffer" or "transceiver," to provide voltage and/or logic interoperability between the VLSI IC and one or more legacy or otherwise incompatible communication interfaces, and/or to otherwise provide required feature enhancements. In the case of a low pin count communication standard, a discrete component interface can sometimes be implemented on the same printed circuit board on which the VLSI IC is installed. However, certain "extra" I/O control signals may be required for direction control, tristate control, clocking or similar functions of such "buffer" devices. Such extra control signals may not be available from the VLSI IC or, if available, may represent extra I/O and cost at the VLSI IC package level.

For higher pin count interfaces, it is often necessary to implement the transceiver, buffer, or other interface on a field-programmable gate array (FPGA) or application specific integrated circuit (ASIC) separately mounted on the printed circuit board with the VLSI IC. Such interfaces typically consume significant additional power and space, and in the case of an FPGA or ASIC there is also typically a high additional cost. Furthermore, this approach can impose a significant speed penalty, due to speed-of-light delays and added capacitance that arise from the interconnections between the transceiver or other interface and the VLSI IC.

What is needed therefore is a device and method of configuration thereof that can flexibly provide at least one enhanced feature that is lacking from a VLSI IC, such as interoperability between the VLSI IC and interface standards that are incompatible with the VLSI IC, for example because they require higher voltages, higher currents, and/or signaling and/or control configurations that are not supported by the VLSI IC, and/or where cold spare support, power gating, and/or another enhanced feature is required but is not supported by the VLSI IC, without requiring an interface buffer or transceiver that is external to the device.

SUMMARY

The present disclosure is a multi-chip module ("MCM") hybrid integrated circuit ("HIC") device, and method of design and production thereof, that can flexibly add enhanced features to a VLSI IC, such as interoperability between the VLSI IC and interface standards that are incompatible with the VLSI IC, including in cases where the interface standard requires higher voltages, higher currents, and/or signaling and/or control configurations that are not supported by the VLSI IC, and/or where another enhanced feature such as cold spare support or power gating is required but is not supported by the VLSI IC, without requiring an interface buffer or transceiver that is external to the device.

The disclosed device incorporates within itself at least one VLSI "core" integrated circuit ("IC") and at least one lower density "chiplet" that are installed together on an interconnecting substrate together with any discrete components such as capacitors or resistors that may be required, and any I/O pins or pads that are needed for connecting the device to an underlying circuit board. Depending on the implementation, the chiplet(s) are unitary elements that can comprise active or passive circuits, or a combination of both, and are accordingly defined herein as "active" chiplets, "passive" chiplets, or "mixed" active/passive chiplets, respectively. In particular, the term "passive chiplet" is defined herein to refer specifically to a unitary element that includes at least 40 passive components, such as resistors, capacitors, and inductors, wherein wiring interconnections, vias, etc. are not considered to be "passive components." Any element of the disclosed device that includes fewer than 40 passive components is defined herein to be a "discrete" passive element, and not a chiplet.

It should further be noted that the scope of the present disclosure includes embodiments wherein the disclosed device includes at least one active or mixed chiplet, i.e. at least one chiplet that includes an active circuit.

Suitable interconnecting substrate styles include multilayer ceramic with wiring embedded in the layers, a ceramic or organic substrate with an "interposer" silicon or glass layer containing additional high density wiring (described in more detail with respect to FIGS. 3C and 3D below), or similar packaging approaches as are known in the art.

The one or more chiplets provide to the device at least one feature that is not directly supported by the VLSI IC, such as providing cold spare support and/or providing intercommunication between the core IC and at least one interface standard that is incompatible with the core IC, for example because it requires signaling at voltages that are higher than the core IC can tolerate, higher output currents, signaling and control features that are not supported by the IC, and/or other features not support by the core IC such as cold spare support. In embodiments, the core IC is a high density (less than 100 nm), low voltage IC.

In embodiments, the present disclosure thereby enables pre-existing VLSI designs to be implemented, either without modification or with only minor modifications, for use in unanticipated applications where the VLSI component would otherwise be incompatible. Similarly, in embodiments the present disclosure enables optimized development of new VLSI ICs by utilizing separate programmable I/O chiplets to implement required features such as problematic I/O types for external communications, while providing a standard set of other features, such as simple I/O types for communication with the VLSI IC. In some embodiments, the features that are incorporated into a given core IC are sufficiently limited such that, by itself, the core IC is not suitable for any specific implementation, but is nevertheless adaptable to a wide range of applications when combined in packages with appropriate chiplets.

In some of these embodiments, providing separate chiplets for intercommunication results in the VLSI IC requiring less ESD protection (machine model for automated handling rather than full human body model), and enables reduction of the size of ESD protection diodes on the VLSI IC die. Furthermore, minimizing the number of different I/O types supported by the VLSI IC reduces development cost and schedule. For example, a VLSI IC that includes a single-ended CMOS I/O operating at low voltage for moderate speed interfaces and a CML I/O for higher speed I/O suffices for many applications.

In embodiments, the disclosed method includes selecting at least one appropriate VLSI core IC and then selecting at least one lower density chiplet from among a plurality of pre-defined active, passive, and/or mixed chiplet designs according to the interface(s) that require support, and/or other features that need to be supported. In some of these embodiments, each of the chiplet designs has a "footprint" (i.e. a two-dimensional shape and I/O placement) that is selected from among a group of defined chiplet footprints.

It should be noted that the scope of the presently disclosed method includes embodiments wherein selecting at least one chiplet includes selecting at least one active or mixed chiplet, i.e. selecting at least one chiplet that includes an active circuit.

An interconnecting substrate is then prepared with the required interconnections for the selected core IC, chiplets, and discrete components such as capacitors or resistors (if any), as well as any required pins or pads for connection with an underlying circuit board.

In some embodiments, the interconnecting substrate is selected from among a plurality of pre-defined interconnecting substrates, each of which includes mounting areas supporting one or more core IC footprints and one or more chiplet mounting positions that are compatible with at least some of the defined chiplet footprints.

In embodiments, the core IC(s) and chiplet(s) are installed within a package, which can include a surrounding wall and in embodiments also includes a lid. According to the embodiment, the interconnecting substrate can either be a unitary part of the package or a separate component that is installed in or on the package, or a combination of both. Finally, the MCM-HIC is assembled from the selected components.

In various embodiments, the core IC's, chiplets, and/or packages (if any) are premanufactured in cost-effective quantities, and can then be selected from an inventory and used on demand as needed when specific requirements arise. In some of these embodiments, the interconnecting substrate is the only element that requires custom manufacture for a new application, so as to provide the interconnections that are needed between the selected, pre-manufactured core IC, chiplet(s), discrete components (if any), package, and I/O pins or pads.

In other embodiments, at least one of the core IC(s), chiplet(s), and/or package is manufactured on demand using pre-established designs. In some of these embodiments, the method further includes modifying the design of at least one of a core IC and/or a chiplet as needed to accommodate an application that cannot be satisfied using only pre-existing designs. For example, a core IC design may be modified so as to provide additional control logic that is needed by the one or more chiplets for interoperability with a required communication standard, and/or a chiplet design may be modified so as to provide one or more other desired features such as cold spare support and/or an optimized layout of connection points and/or to optimize the interface standard used to communicate with an external interface.

Notably, the cost of adding special features to an existing VLSI IC design for a custom core IC production run can be relatively low, because the customized features that are added are generally modest changes to details of the design, such as adding additional logic outputs that do not change the number of production steps, the resolution, or any other aspects of the production process. Furthermore, in many cases the customized changes, such as added logic outputs, do not interfere with the normal operation or use of the chip, nor do they significantly change its physical configuration, power consumption, or other features, such that any excess production of customized core IC's can be absorbed by other applications that do not require, but also are not affected by, the customized features.

The disclosed method thereby allows a MCM-HIC device having desirable capabilities derived from a pre-existing core IC design, customized I/O interoperability, and/or other desired features such as cold spare support, to be readily and flexibly configured and manufactured for a specific application in a cost-effective manner, even when the required production quantities are modest or low.

In embodiments, at least one of the core IC(s) and/or chiplet(s) is a "flip-chip" having connection points provided on its top surface and configured for inverted mounting to the interconnecting substrate. In other embodiments, at least one of the core IC(s) and/or chiplet(s) is configured for non-inverted mounting with top surface signals wire-bonded to the substrate. In embodiments, at least one of the core IC(s) and/or chiplet(s) is configured with through-silicon via interconnections for 2.5D or 3D packaging. In embodiments, the MCM-HIC can be hermetic or non-hermetic, can be radiation hardened, can include electrostatic discharge (ESD) mitigation and/or can support cold spare operation.

One general aspect of the present disclosure is a multi-chip module hybrid integrated circuit that includes an interconnecting substrate, at least one VLSI core integrated circuit ("IC") installed on said interconnecting substrate, at least one chiplet installed on said interconnecting substrate, the at least one chiplet being an active chiplet that comprises at least one active circuit, a mixed chiplet that comprises at least one active circuit and at least one passive circuit, or a passive chiplet that comprises at least 40 passive components, not including interconnections therebetween, and a plurality of output connections configured to provide intercommunication between the device and at least one external apparatus, wherein said interconnecting substrate provides interconnection between said at least one core IC and said at least one chiplet, and said at least one chiplet implements at least one enhanced feature that is not implemented in the core IC.

In embodiments, the at least one enhanced feature includes enabling intercommunication between the at least one core IC and at least one external device using a communication protocol that is not supported by the at least one core IC. In some of these embodiments, the at least one chiplet enables intercommunication between the core IC and the at least one external device using a plurality of communication protocols that are not directly supported by the core IC.

In any of the above embodiments, the at least one enhanced feature can include enabling intercommunication between the at least one core IC and at least one external device using at least one of signal voltages, control voltages, and output currents that are too high for the core IC to produce and/or tolerate.

In any of the above embodiments, the at least one advanced feature can include enabling intercommunication between the at least one core IC and at least one external device using control signals that the core IC cannot produce.

In any of the above embodiments, the at least one enhanced feature can include support of cold spare operation.

In any of the above embodiments, the at least one enhanced feature can include power gating of the core IC.

In any of the above embodiments, at least one of the chiplets can be a programmable chiplet. In some of these embodiments, the programmable chiplet is programmable using a permanent programming method that includes at least one of mask programming during manufacture of the programmable chiplet, laser programming, eFuse programming, and antifuse programming. In any of these embodiments, the programmable chiplet can include at least one of non-volatile and volatile memory that is able to accept and store program instructions for execution by the programmable chiplet. And some of these embodiments further comprise a user-accessible programming interface that provides programming access for a user to transfer program instructions to the programmable chiplet after it has been installed in the circuit.

In any of the above embodiments, the at least one core IC and at least one chiplet can be hermetically sealed within a compartment included in the multi-chip module hybrid integrated circuit.

In any of the above embodiments, the circuit can include at least one of radiation hardening and electrostatic discharge (ESD) mitigation.

In any of the above embodiments, the interconnecting substrate can comprise a primary region and an interposer region, and wherein said regions differ from each other in at least one of interconnection density and interconnection current capacity. And in some of these embodiments an upper surface of the interposer region is level with an upper surface of the primary region, and wherein at least one of the chiplets overlaps a boundary between the primary and interposer regions of the interconnecting substrate, so that direct interconnections are formed between the overlapping chiplet and the primary region, and between the overlapping chiplet and the interposer region.

A second general aspect of the present disclosure is a kit for producing a multi-chip module hybrid integrated circuit, which includes an interconnecting substrate, at least one VLSI core integrated circuit ("IC") that is/are or can be installed on said interconnecting substrate; and a plurality of chiplets compatible for installation on said interconnecting substrate on at least one chiplet-compatible chip site provided on said interconnecting substrate, wherein said plurality of chiplets includes at least one of an active chiplet that comprises at least one active circuit, a mixed chiplet that comprises at least one active circuit and at least one passive circuit, and a passive chiplet that comprises at least 40 passive components, not including interconnections therebetween; wherein said interconnecting substrate provides interconnection between said core IC and said at least one chip site; and wherein for each of a plurality of enhanced features that are not supported by said core IC, a group of one or more of said chiplets can be installed on said interconnecting substrate so as to implement said enhanced feature.

In embodiments, the kit comprises a plurality of core ICs that are and/or can be installed on the interconnecting substrate.

In any of the above embodiments, the kit can comprise a plurality of interconnecting substrates configured for interconnecting different core IC and chip site combinations.

In any of the above embodiments, the plurality of chiplets can include a group of one or more of said chiplets that can be installed on said interconnecting substrate so as to enable intercommunication between the at least one core IC and at least one external device using a communication protocol that is not supported by the at least one core IC.

In any of the above embodiments, the plurality of chiplets can include a group of one or more of said chiplets that can be installed on said interconnecting substrate so as to enable support of cold spare operation.

In any of the above embodiments, the plurality of chiplets can include a group of one or more of said chiplets that can be installed on said interconnecting substrate so as to enable power gating of the core IC.

And in any of the above embodiments, the plurality of chiplets can include at least one programmable chiplet.

A third general aspect of the present disclosure is a method of preparing a multi-chip module hybrid integrated circuit that enables an enhanced feature that is not implemented in a core IC. The method includes selecting a group of one or more chiplets, said group of chiplets being configured to enable said enhanced feature, said group of chiplets including at least one of an active chiplet that comprises at least one active circuit, a mixed chiplet that comprises at least one active circuit and at least one passive circuit, and a passive chiplet that comprises at least 40 passive components, not including interconnections therebetween, configuring an interconnecting substrate to provide interconnection between said core IC and said group of chiplets, and installing the group of chiplets and the at least one core IC on said interconnecting substrate.

Embodiments further comprise modifying at least one of intercommunication circuitry and interconnection placement of a design of the core IC and then producing the core IC according to the modified design before installing it on the interconnecting substrate. And in some of these embodiments the modified core IC can be used interchangeably with ICs produced according to the corresponding unmodified design.

In any of the above embodiments, selecting the group of chiplets can include modifying a preexisting design of at least one of the chiplets, and then producing the modified chiplet before installing it on the interconnecting substrate.

In any of the above embodiments, selecting the group of chiplets can include selecting at least one programmable chiplet and programming the programmable chiplet.

Any of the above embodiments can further comprise designing and pre-manufacturing a plurality of chiplets having a plurality of configurations, and wherein selecting the group of chiplets includes selecting at least one chiplet from among the plurality of premanufactured chiplets.

And in any of the above embodiments the enhanced feature can be power gating of the core IC.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 3C is a top view of an embodiment of the present disclosure that includes five chiplets and an interposer;

DETAILED DESCRIPTION

Figure 1:
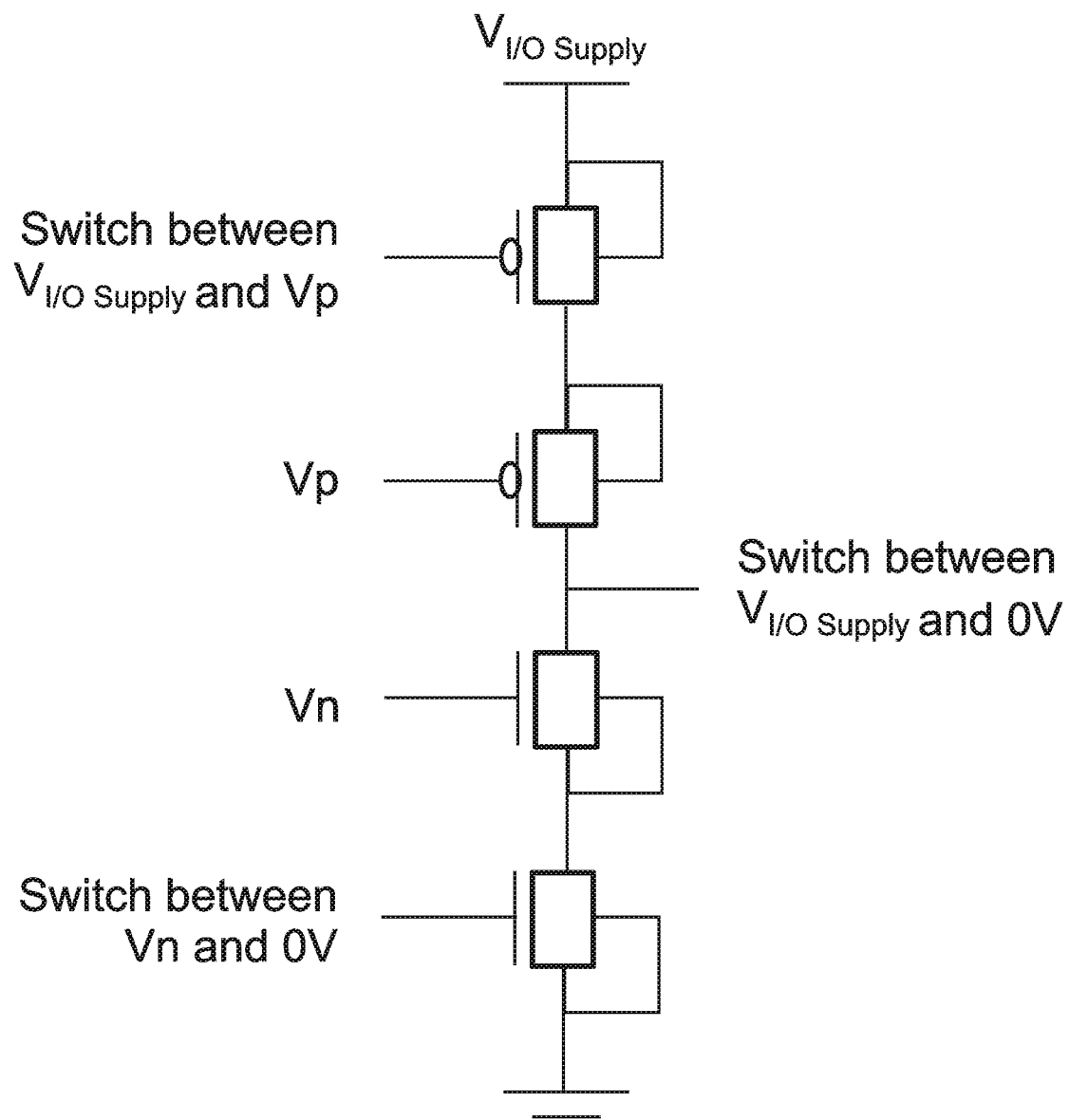
FIG. 1 is a circuit diagram that illustrates a "stacked" configuration of transistors that provides increased input/output voltages according to the prior art.
Figure 2A:
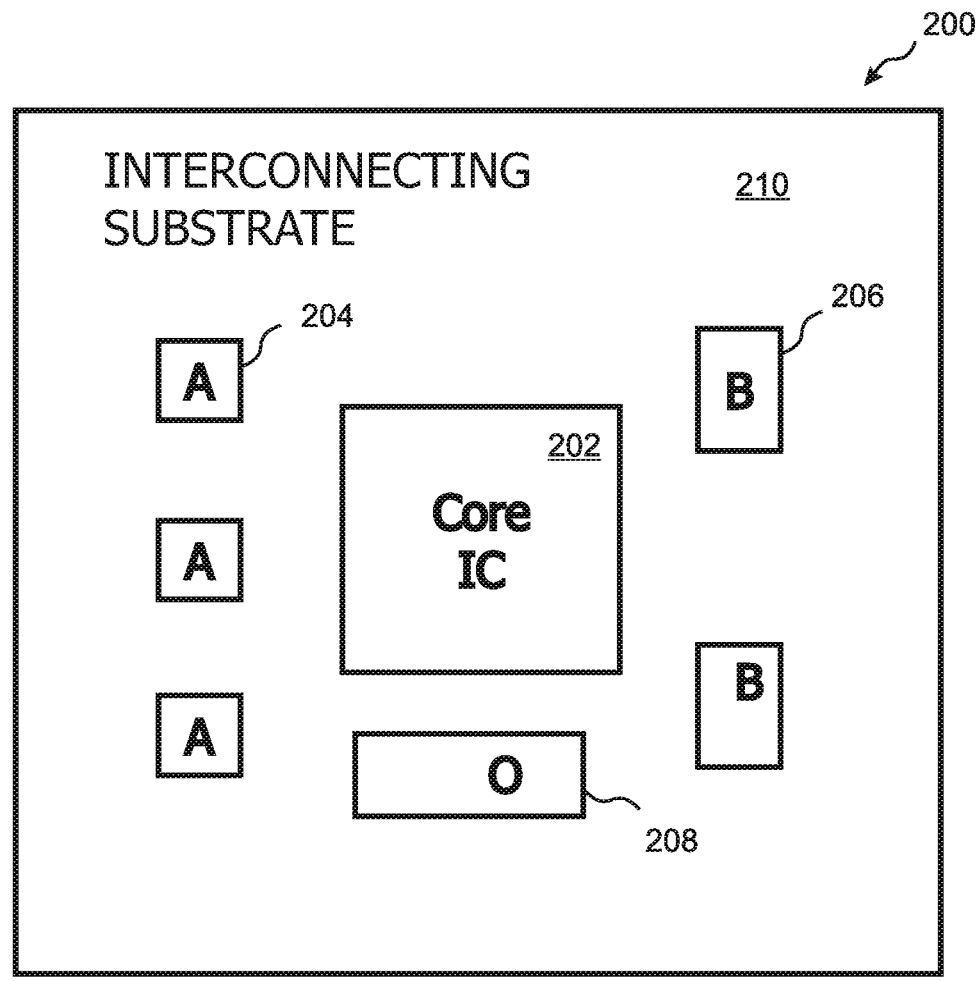
FIG. 2A is a top view of an embodiment of the present disclosure that includes mounting areas with interconnection patterns for 6 chiplets distributed over 3 footprints.

With reference to FIG. 2A, the present disclosure is a "system-in-a package" multi-chip module ("MCM") hybrid integrated circuit ("HIC") device 200, and method of design and production thereof, wherein the device 200 includes at least one VLSI "core" integrated circuit ("IC") 202 and at least one lower density "chiplet" IC 204, 206, 208 that provides a feature that is not independently supported by the core IC 202. In various embodiments, the chiplets 204, 206 are unitary elements that can comprise active circuits, passive circuits, and/or a combination of active and passive circuits, and are correspondingly defined herein as "active" chiplets, "passive" chiplets, and "mixed" chiplets, respectively. In particular, the term "passive chiplet" is defined herein to refer specifically to a unitary element that includes at least 40 passive components, such as resistors, capacitors, and inductors, wherein wiring interconnections, vias, etc. are not considered to be "passive components." Any element of the disclosed device that includes fewer than 40 passive components is defined herein to be a "discrete" passive element, and not a chiplet.

It should further be noted that the scope of the present disclosure includes embodiments wherein the disclosed device includes at least one active or mixed chiplet, i.e. at least one chiplet that includes an active circuit.

Enhanced features provided by the one or more chiplets 204, 206, 208 can include providing intercommunication between the core IC 202 and at least one otherwise incompatible communication standard (such as PCI and other legacy standards that require signaling at voltages that are higher than the core IC 202 can tolerate), providing output currents that the core IC 202 cannot support, providing signaling and/or I/O control configurations that the core IC 202 does not provide, and/or other desired intercommunication features such as cold spare support and/or power gating.

Figure 2B:
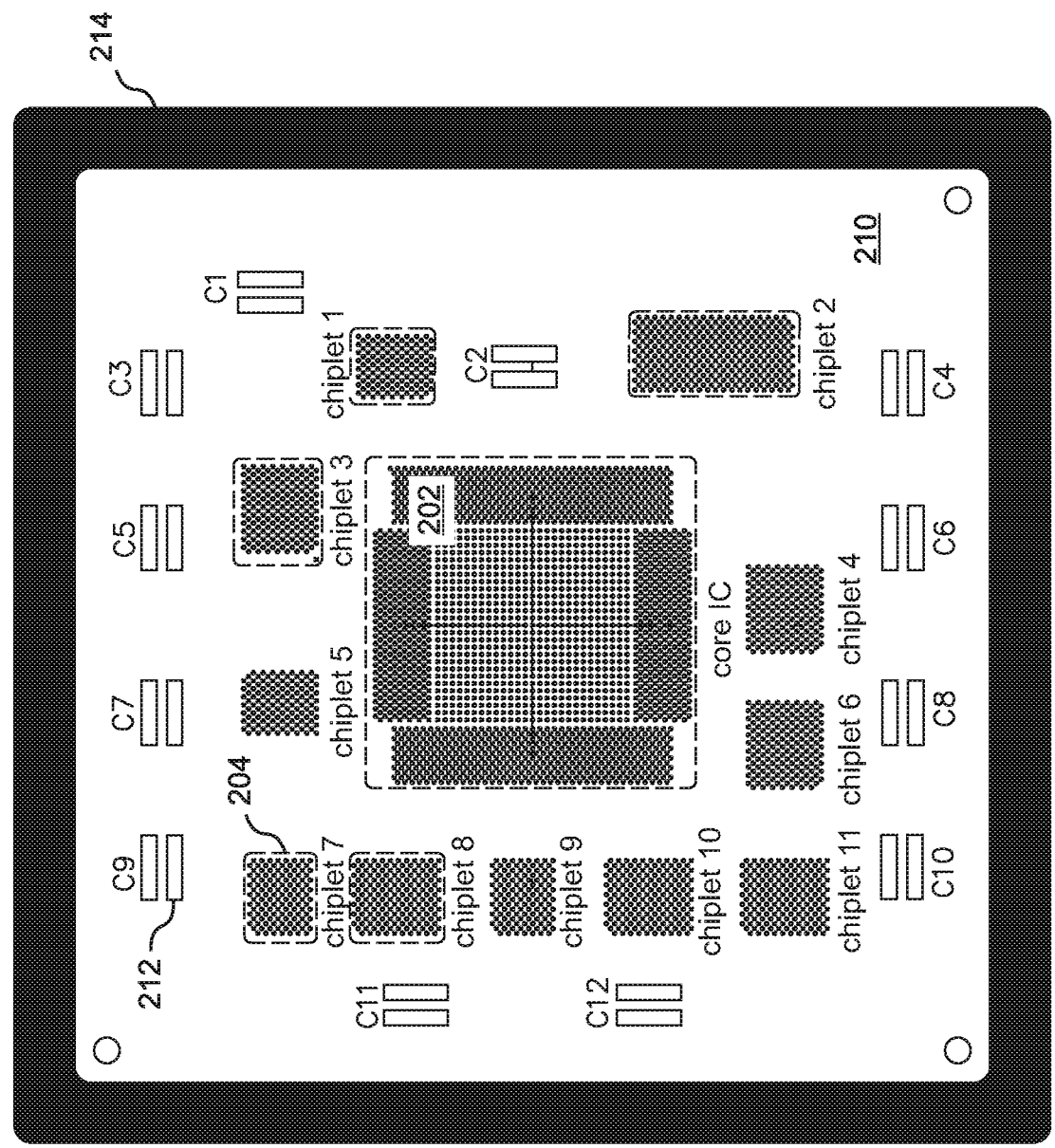
FIG. 2B is a top view of an embodiment of the present disclosure that includes mounting areas with interconnection patterns for 11 chiplets distributed over a plurality of footprints, and also including a plurality of capacitors as discrete passive components.
Figure 2C:
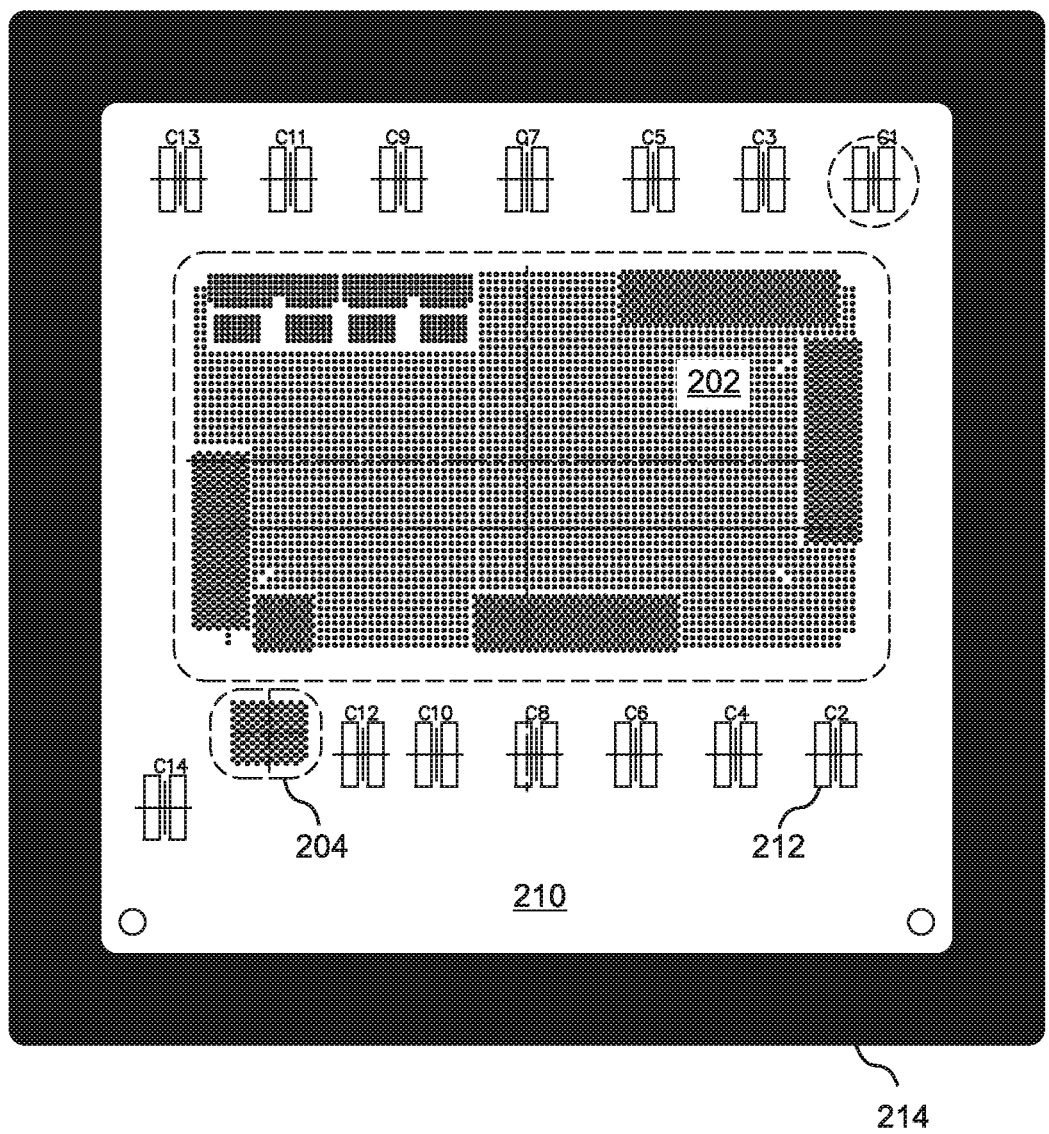
FIG. 2C is a top view of an embodiment of the present disclosure that includes only one chiplet mounting area, together with a plurality of capacitors as discrete passive components.

The disclosed MCM-HIC device 200 includes an interconnecting substrate 210 onto which the core IC 202 is installed together with the at least one chiplet 204, 206, 208. Three chiplets 204, 206, 208 are included in the example of FIG. 2A. In the example of FIG. 2B, the interconnecting substrate 210 includes mounting areas with interconnection patterns for 11 chiplets 204 of various "footprint" sizes and types (labeled chiplets 1-11), a mounting area with interconnect pattern for one core IC 202, and mounting locations for 12 individual capacitors 212 that are to be included as discrete passive components. FIG. 2C illustrates an embodiment wherein the interconnecting substrate 210 includes mounting areas for a core IC 202 and only one chiplet 204.

In the embodiment of FIG. 2A, the core IC 202 and chiplets 204, 206, 208 are mounted to the interconnecting substrate but are otherwise exposed, or covered by epoxy or similar substance, i.e. "glob top", whereas in the embodiments of FIGS. 2B and 2C, the core IC 202 and chiplets 204, 206, 208 are surrounded by a "wall" 214, which can be filled e.g. with an epoxy or similar substance to encapsulate the surrounded components, or covered by a lid to form a containing enclosure, as described in more detail below.

In some embodiments that include a surrounding wall 214, the wall 214 is unitary with the interconnecting substrate 210. In other embodiments, the wall 214 is a separate element that is installed on or surrounds the interconnecting substrate 210.

Figure 2D:
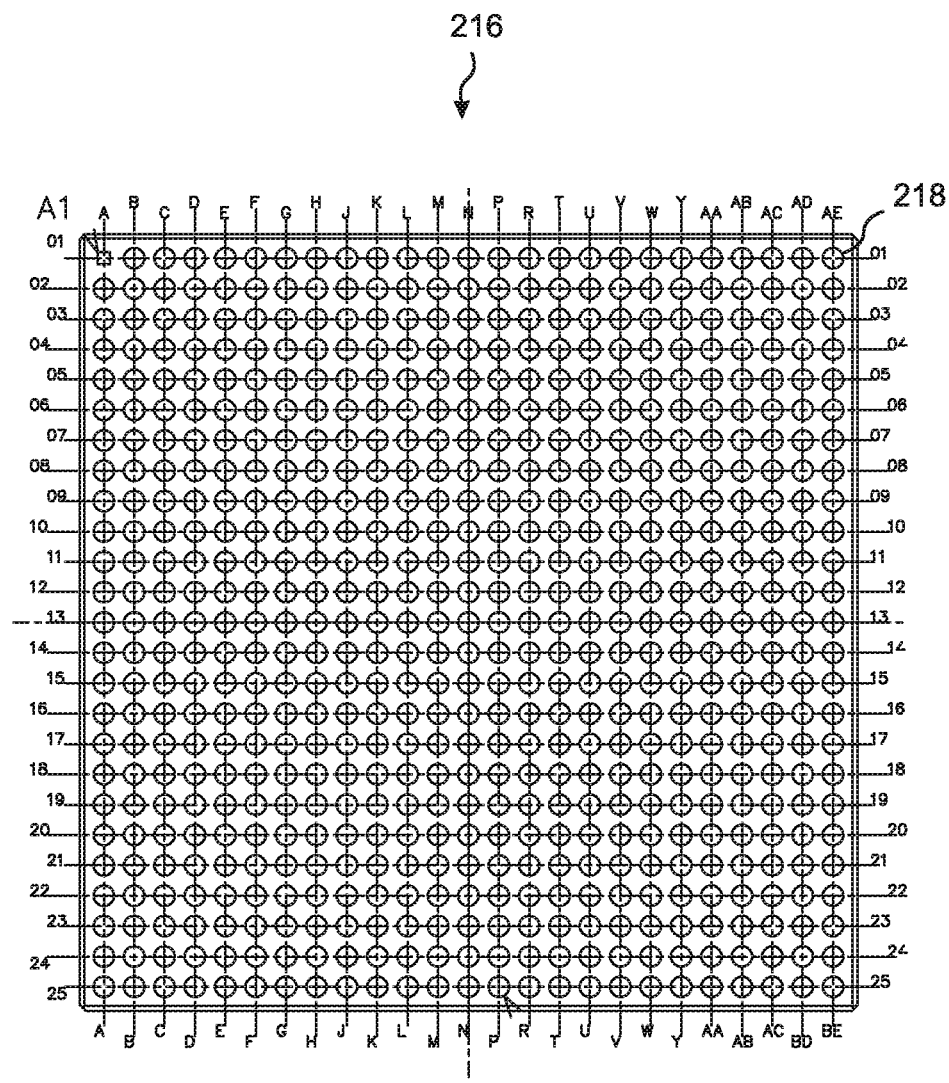
FIG. 2D is a bottom view of an interconnecting substrate according to an embodiment of the present disclosure.

With reference to FIG. 2D, in some embodiments, the interconnecting substrate 210 provides the pads, columns, and/or other connectivity 218 that are required for connection to an underlying circuit board (not shown), while in other embodiments the interconnecting substrate 210 is installed on top of a package bottom 216 that provides the required connectivity 218 to the underlying circuit board. In some of these embodiments, the package bottom 216 is unitary with a surrounding wall 214, forming a compartment within which the interconnecting substrate 210 and attached components 202-208, 212 are installed. This can allow, for example, an interconnecting substrate made of a material such as glass, silicon, ceramic or another suitable material to provides at least some of the IC interface and interconnection wiring layers, while the wall and/or package bottom 210 can be ceramic, or they can be plastic, or made from another organic material, depending on the application.

Figure 3A:
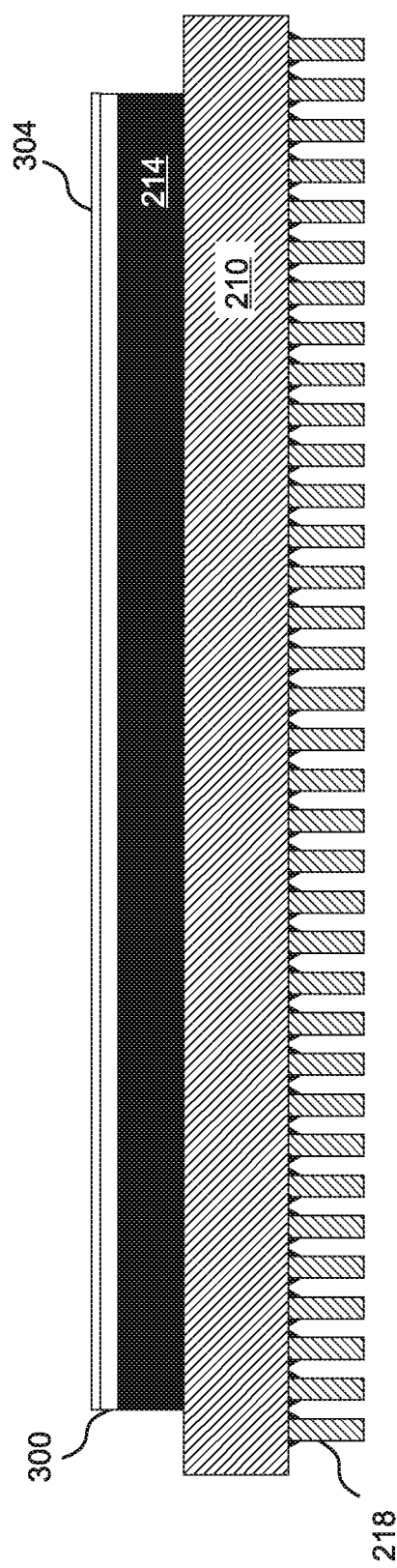
FIG. 3A is a side view of an embodiment of the present disclosure.

FIG. 3A is a side view of an embodiment that includes a wall 214 installed on top of an interconnecting substrate, wherein the interconnections between the interconnecting substrate 210 and an underlying circuit board (not shown) are formed by a ceramic column grid array (CCGA) 218, as is typically used for space applications.

Figure 3B:
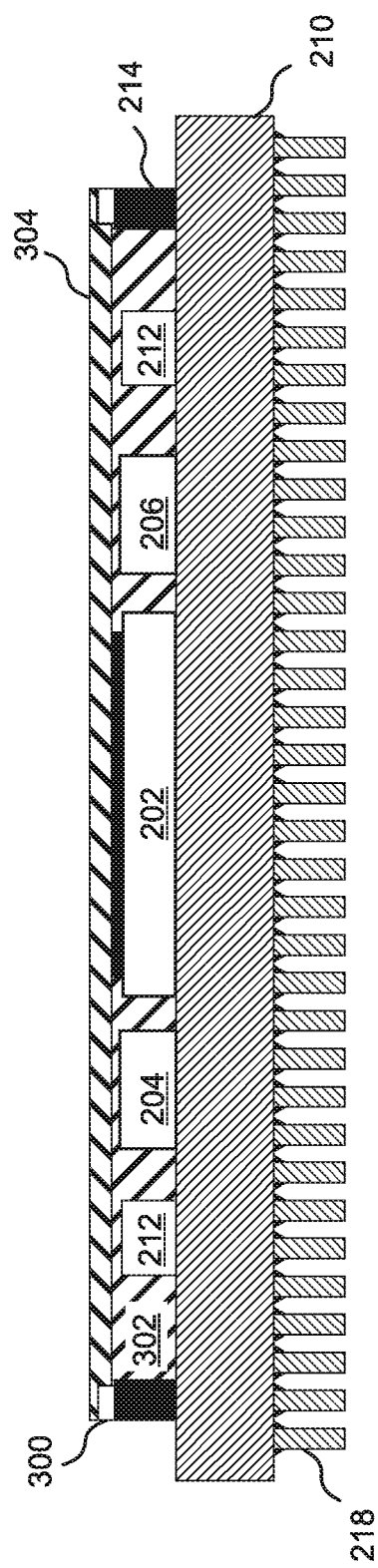
FIG. 3B is a cross sectional view of the embodiment of FIG. 3A with core IC, chiplets and individual capacitors installed.

FIG. 3B is a cross-sectional view of the embodiment of FIG. 3A. In this embodiment, the surrounding wall 214 is hermetically sealed by a cover 304 soldered to a ring 300 affixed to the top of the wall 214, so that the cover 304, wall 214, and interconnecting substrate 210 together form a hermetically sealed chamber 302 that contains the core IC 202, chiplets 204, 206, 208, and any supporting components such as capacitors 212 or resistors. The interconnecting substrate 210 in the example of FIG. 3B is constructed using multiple layers of ceramic with wiring traces on each layer and vias providing interconnection between layers. The core IC 202, chiplets 204, 206, 208, and other components 212 are soldered to metal pads provided on the surface of the interconnecting substrate 210.

According to the illustrated embodiment of FIGS. 3A and 3B, vertical solder columns 218 extend from a bottom surface of the interconnecting substrate 210 for electrical connection to an underlying circuit board (not shown) with flexing, so as to accommodate differences in thermal expansion between the interconnecting substrate 210 and the underlying board, as might be experienced in extreme environments such as space applications. Similar embodiments are configured with a "land grid" array, whereby pads are provided on the bottom of the interconnecting substrate 210 or package bottom 216, instead of the illustrated columns 218.

With reference to FIG. 3C, in various embodiments the interconnecting substrate includes a primary section 210 that is augmented by an "interposer" section 306, typically made of silicon. Depending on the embodiment, the interposer can be installed on top of the primary section 210 or, as illustrated in FIG. 3C, it can be installed in a cavity provided in the primary section 210 of the substrate, so that the top of the interposer 306 is flush with the top of the primary section 210. According to this latter approach, at least some of the chiplets 204-208 overlap the boundary between the interposer section 306 and the surrounding primary section 210, and directly interface with both sections 306, 210. Because interconnection wiring is present within both the interposer section 306 and the primary section 210 of the interconnecting substrate, the combination is sometimes referred to as a "2.5D" substrate, as compared to a single section "2D" substrate 210 as shown for example in FIGS. 3A and 3B.

This interposer approach is helpful, for example, when chiplets are used to provide interconnectivity between a low voltage, low current core IC 202 and a higher voltage, higher current communication standard. In some of these embodiments, the primary section 210, is configured with lower density interconnections that are suitable for relatively higher currents, while the interposer section 306 is configured with interconnections that are higher density and suitable for relatively lower currents.

Note that for 2D interconnecting substrates, the "primary" section 210 is the only section of the substrate. Hence, element number 210 is used herein in the drawings to refer to the entire interconnecting substrate in the case of 2D interconnecting substrates, but is used to refer only to the "primary" section of a multi-component 2.5D interconnecting substrate that includes an interposer 306.

Figure 3D:
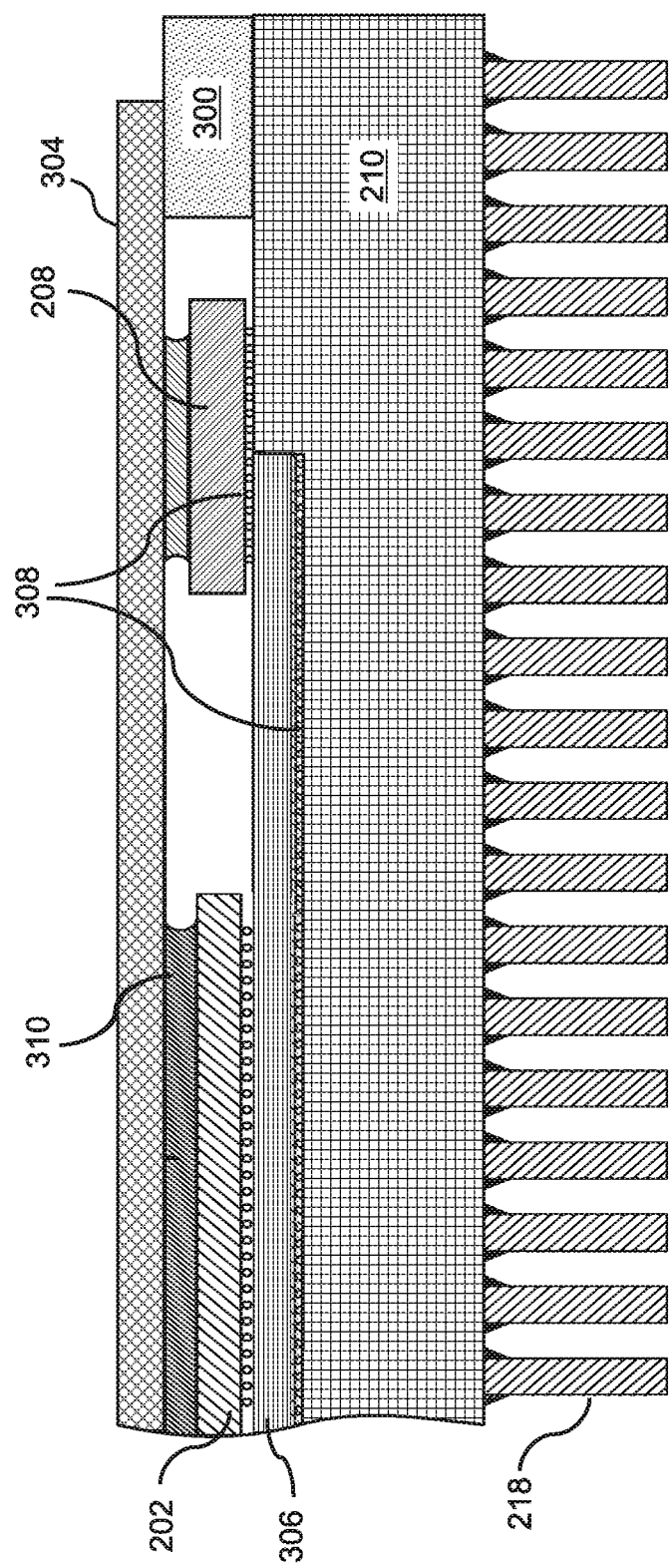
FIG. 3D is a cross sectional view of the right side of the embodiment of FIG. 3C.

As illustrated in FIG. 3D, which is a cross sectional view of the right half of FIG. 3C, at least some of the chiplets 204-208 can be mounted such that they straddle the boundary of the interposer layer 306, and thereby are able to make direct contact with both layers 306, 210 of the substrate, thereby providing optimal connectivity with both the lower current VLSI core IC 202 and the higher current communication standard.

Referring again to FIGS. 3C and 3D in more detail, FIG. 3C is a top view of a MCM-HIC device 300 (with the lid 304 omitted so that the internal elements can be seen) in an embodiment that includes a VLSI core IC 202 and five I/O chiplets 204-208, along with four discrete capacitors 212. Similar embodiments can include other components, such as resistors, as needed. FIG. 3D is a cutaway view of the device 300 of FIG. 3C, showing the right side of the core IC 202, including one of the I/O chiplets 208.

Note that in both FIGS. 3C and 3D, the I/O chiplets 204-208 are configured such that they straddle the boundary between the interposer and the substrate, thus allowing the I/O chiplet to interconnect with both the high-density interposer 306 wiring and the high-current substrate wiring 210.

In the illustrated embodiment, the primary layer of the interconnecting substrate 210 includes a cavity wherein the interposer 306 is mounted, such that the top surface of the interposer 306 is co-planar with the adjacent top surface of the underlying primary substrate layer 210.

In the illustrated example, the Core IC 202 is mounted on the interposer 306 and is interconnected to the interposer 306 using through-silicon vias and/or solder balls 308. Embodiments further include thermal fill materials 310 as are known in the art between the core IC 202 and/or chiplets 204-208 and the lid 304 so as to manage heat dissipation to the lid. Although not illustrated in the figure, under-fill materials as are known in the art can also be included between the core IC 202 and/or chiplets 204-208 and the interposer, between the chiplets 204-208 and the primary section 210 of the substrate, and/or between the interposer 306 and the primary section 210 of the substrate to mitigate thermal stress, shock and vibration.

Figure 4A:
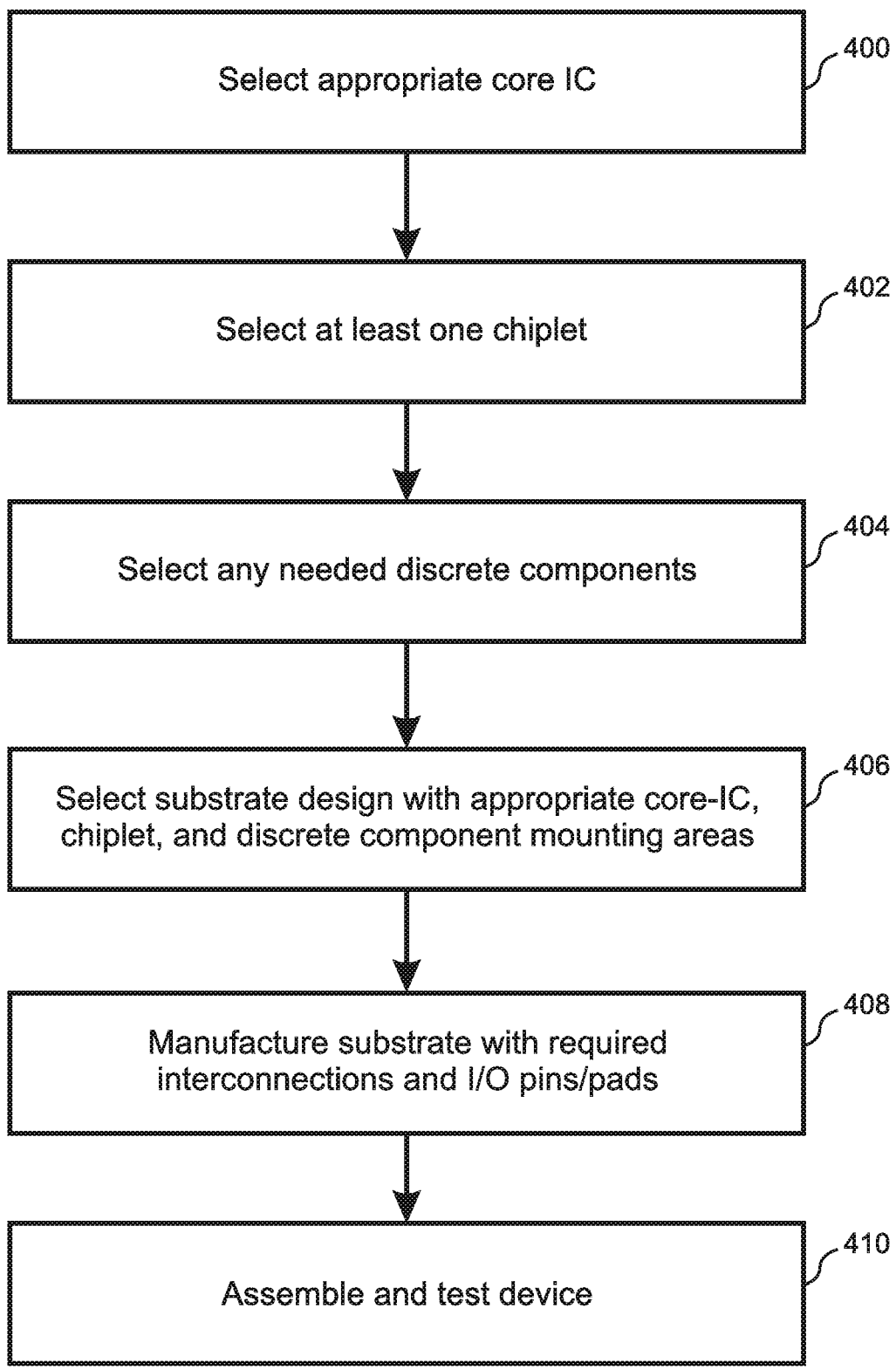
FIG. 4A is a flow diagram illustrating a method embodiment of the present disclosure.

With reference to FIG. 4A, in embodiments the disclosed method of configuring and manufacturing a MCM-HIC device 200 for a new application includes selecting an appropriate VLSI core IC 400 and at least one chiplet 402 from among a plurality of pre-defined chiplet designs, as well as any discrete components 404 such as capacitors, resistors, etc., that may be needed. In some of these embodiments, at least some of the chiplet designs have a die size or "footprint" (i.e. a two-dimensional shape and I/O locations) that is selected from among a group of defined chiplet footprints. In various embodiments, at least one of the chiplet designs includes cold spare features, thereby enabling the design and construction of devices 200 that support cold spare operation.

In embodiments, an interconnecting substrate design is selected 406 from among a plurality of pre-defined substrate designs that specify die layouts, numbers of layers, material of construction, etc. In particular, each of the substrate designs includes at least one core IC die configured for compatibility with a standard core IC footprint, and one or more chiplet dies that are compatible with one or more of the defined chiplet footprints. For example, the illustration in FIG. 2A includes three chip sites 204 prepared for chiplets with footprint type "A," two chip sites 206 prepared for chiplets with footprint type "B," and one chip site 208 designated "O" for "other" that is custom sized for a non-standard chiplet footprint. In embodiments, at least some of the interconnecting substrate designs include additional chip sites for installing discrete components 212, as shown in FIG. 2B. Note that while the example of FIG. 2B includes chip sites for a plurality of chiplets 204, 206, 208, the example illustrated in FIG. 2C includes only one chiplet chip site 204.

A substrate is then manufactured 408 according to the selected substrate design that provides the required interconnections for the selected core IC, chiplets, and discrete components (if any), as well as required pins or pads for connection to an underlying circuit board. Finally, the MCM-HIC is assembled 410 from the selected and prepared components.

In some embodiments, at least some modified core IC 202 and/or chiplet 204-208 designs are pre-manufactured in cost-effective quantities, so that they can be selected and assembled from an inventory as needed. In some of these embodiments, the interconnecting substrate 210 is the only element that requires custom manufacture for a new application, so as to provide the interconnections and I/O pins or pads that are required by the new device design.

In other embodiments, one or more of the core IC, 202, and/or chiplets 204-208 is manufactured on demand according to the requirements of the application once the necessary designs have been selected. In some of these embodiments, at least one of the core IC 202 and/or chiplet(s) 204-208 is manufactured on demand using a pre-established design. In various embodiments, the method further includes modifying the design of at least one of the core IC(s) 202, and/or at least one chiplet 204, or creating an entirely new design as needed to accommodate an application that cannot be satisfied using only pre-existing designs.

The pre-defined chiplet designs can include any of several footprints, as well as support for different core IC I/O requirements, support for different core IC features, and support for different external interface types. Examples are given in Tables 1-3 below.

TABLE 1

Options for chiplet core IC interface types

Bidirectional CMOS
Unidirectional CMOS
Bidirectional Open Drain/Source CMOS
Unidirectional Open Drain/Source CMOS
CMOS/PMOS/NMOS Switch
+3.3 V PCI Compliant CMOS
LVDS Input
LVDS Output
CML Input (including SerDes)
CML Output (including SerDes)
High-Speed Current Steering Logic (HCSL)
Power Supply Switch
Programmable I/O

TABLE 2

Optional chiplet features for support of core IC

I/O Direction Control
I/O Tri-state Control
I/O Switch Enable Control
Independent Input/Output Driver Tri-state Control
Power Saving Features
Power Sequence Flexibility
Pull-up/Pull-down Assist Circuitry
Configuration Programming Interface
Mode Controls

TABLE 3

Options for chiplet external interface types

Bidirectional CMOS
Unidirectional CMOS
Bidirectional Open Drain/Source CMOS
Unidirectional Open Drain/Source CMOS
+3.3 V PCI Compliant CMOS
CMOS/PMOS/NMOS Switch
LVDS Input
LVDS Output
CML Input (SerDes)
CML Output (SerDes)
High-Speed Current Steering Logic (HCSL)
LVPECL
Programmable I/O It should be noted that separate chiplets 204 can be used for input and output interfacing, and that support can be provided by a single device 200 for more than one type of communication standard by including the required chiplets 204 and associated discrete components 212 (if any) for each of the supported communication standards.

Other enhancements that are provided by chiplets in various embodiments include cold spare support, radiation hardening, and/or electrostatic discharge mitigation.

Figure 4B:
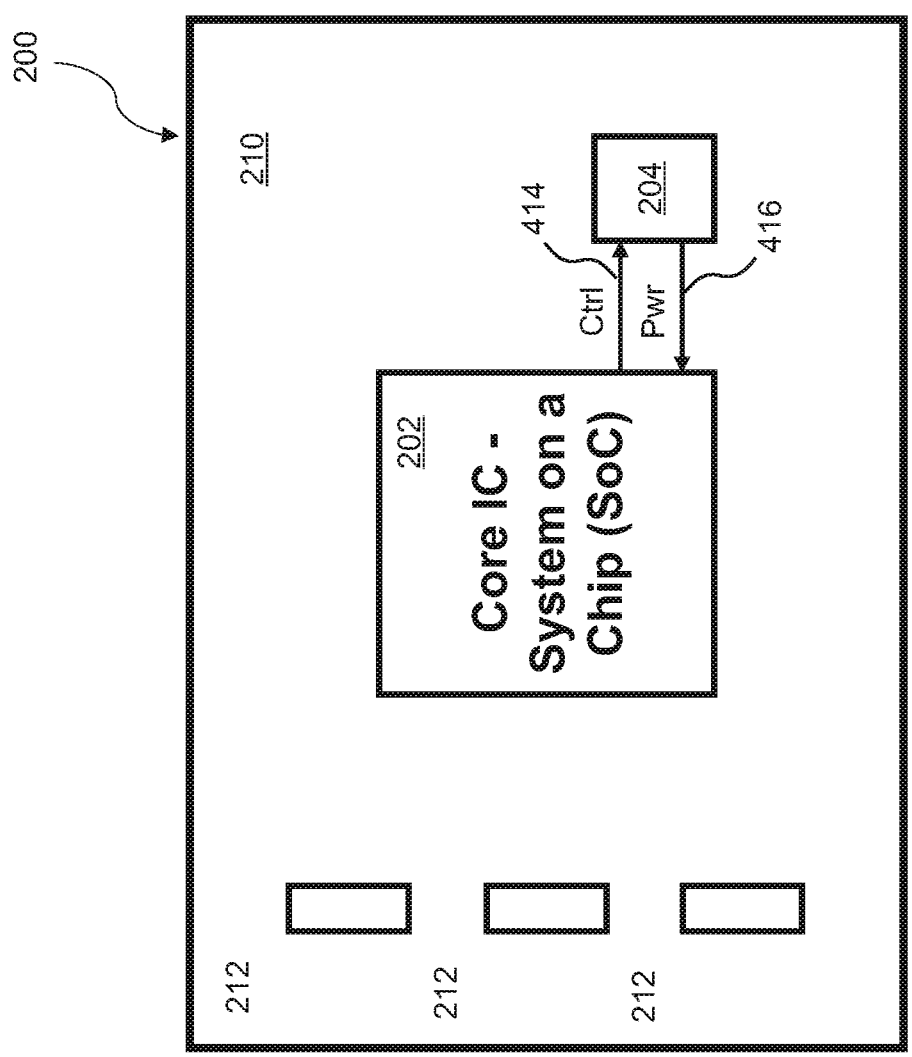
FIG. 4B is a block diagram illustrating power gating implemented by a chiplet in an embodiment of the present disclosure.

For example, with reference to FIG. 4B, one method for retaining the advantages of on-die power gating while addressing long-term reliability challenges is implementing power gating in a chiplet. Implementing power gating in a chiplet rather than within the SoC allows use of less advanced technology that can occupy more physical area to reduce power density and contains larger internal interconnections that are much more resilient to wire wear out.

In the embodiment of FIG. 4B, the MCM-HIC device 200 includes an interconnection substrate 210 onto which a SoC is installed as the core IC 202, together with a chiplet 204 as well as 3 capacitors 212 that are included as discrete components. The chiplet 204 in this embodiment functions as a power supply switch that is enabled and disabled by the Core IC 202 via control signals 414. When enabled, the chiplet 204 passes the supply voltage 416 to the portion of the Core IC 202 that is being power managed. When disabled, the chiplet 204 disconnects the supply voltage 416 from the portion of the Core IC 202 that is being power managed, thereby eliminating nearly all of the wasted power consumption. In similar embodiment, one or more chiplets 204 are used as both a power supply switch and a voltage regulator, so as to enable operation of the SoC 202 at voltage levels that are not readily available on the underlying printed circuit board (not shown).

It will be clear to those of skill in the art that there are many possible combinations of internal core IC type, external communication interface type, and other features that can be supported by the various chiplet designs of the present disclosure. It should further be clear that the flexibility of the disclosed device 200 arises both from the variety of features that can be included in chiplets 204, as well as the ability to select and include a plurality of pre-defined, pre-manufactured, and/or custom chiplets 204 in a given device 200, according to the requirements of each application.

Example 1: PCI Interfacing

Figure 5A:
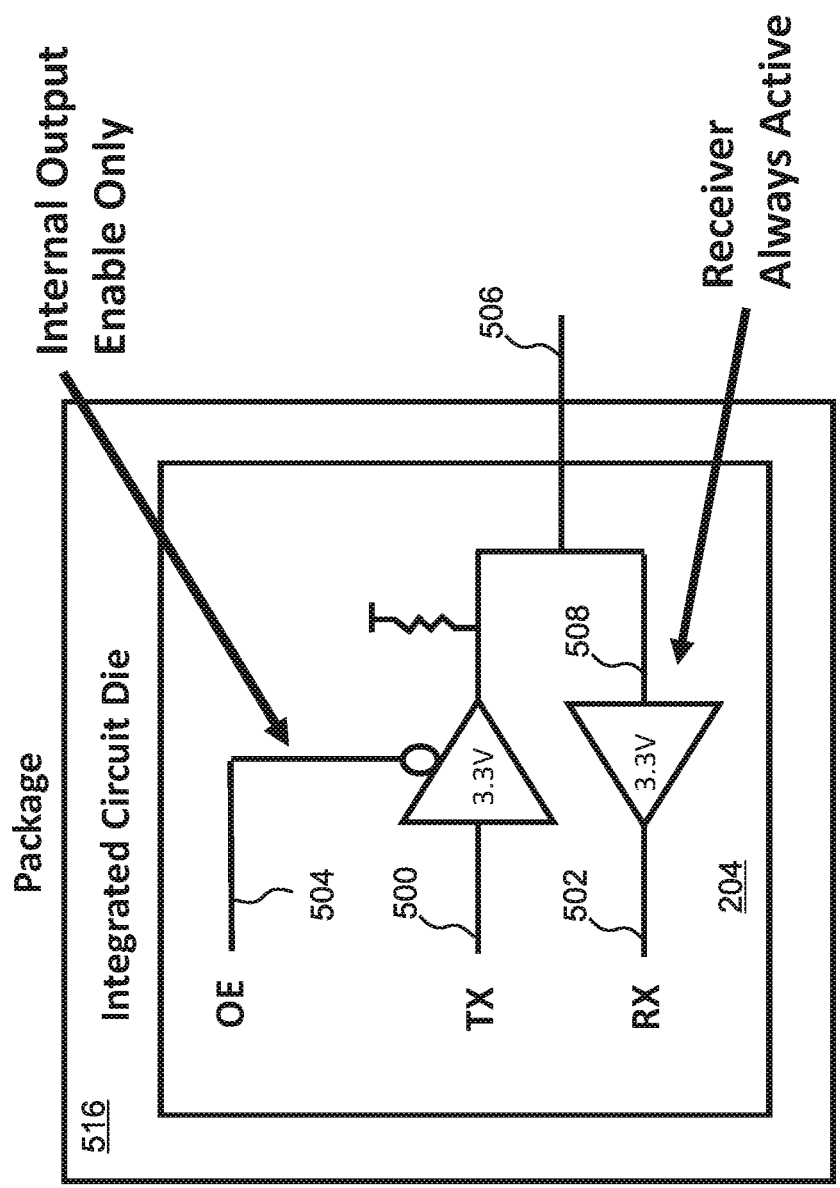
FIG. 5A is a typical bidirectional PCI I/O circuit included within a traditionally designed IC of the prior art.

FIG. 5A illustrates a typical bidirectional PCI I/O circuit included within a traditionally designed IC 516 of the prior art. In the example shown in FIG. 5A, the input receiver 508 is configured to be always active meaning that the state of the primary I/O signal 506 is always buffered to the receiver output 502. Furthermore, transmitter data 500 is only output to the primary I/O signal 506 when the IC logic activates the output enable signal 504. In the absence of external transceivers, this embodiment of I/O control signaling is sufficient to maintain compliance with the PCI protocol standard.

Figure 5B:
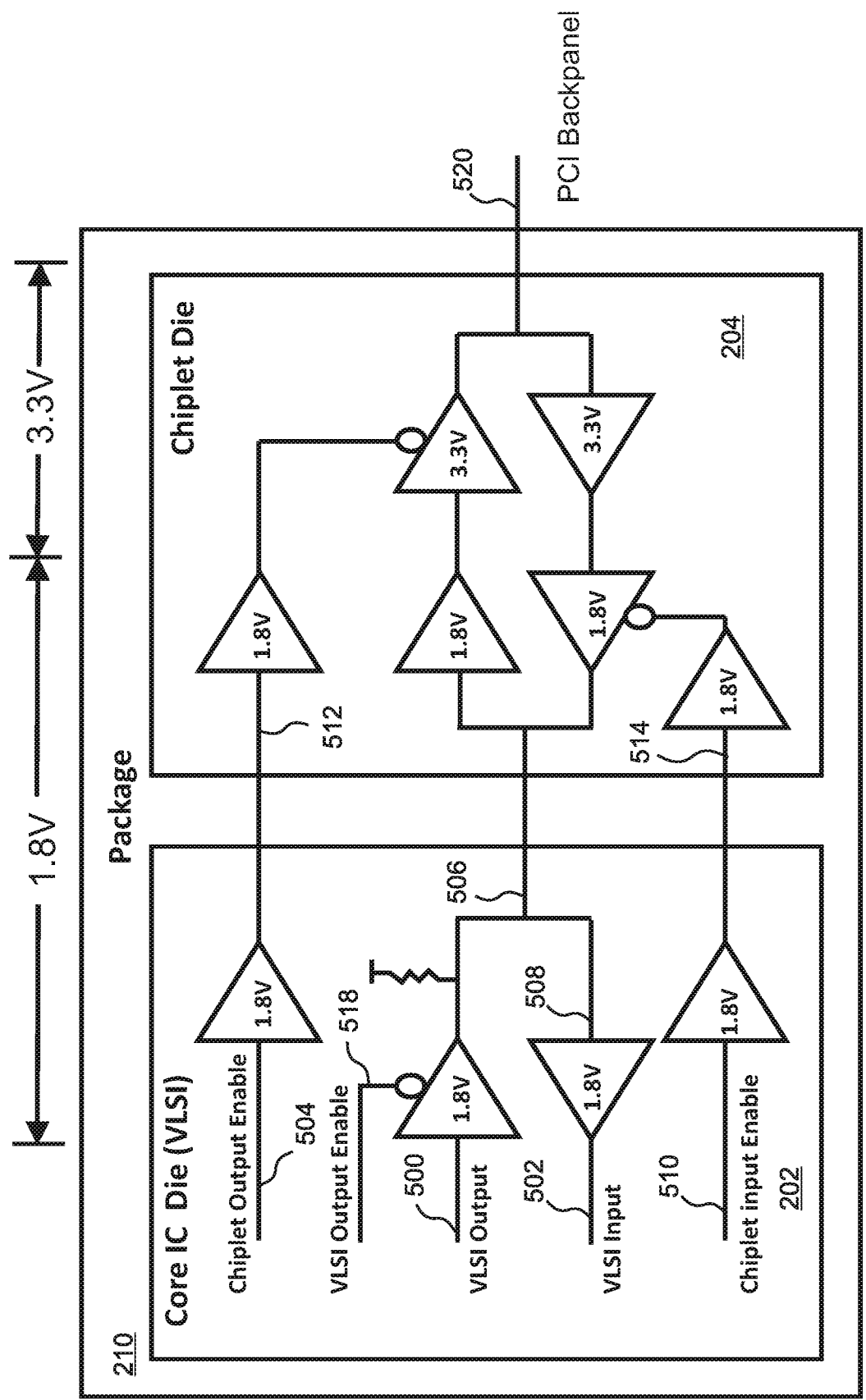
FIG. 5B is a circuit diagram of an embodiment of the present disclosure that enables a 1.8V core IC to communicate with a 3.3V PCI interface.

FIG. 5B illustrates the interconnections between an I/O circuit included in a core IC 202 and a PCI bidirectional I/O transceiver chiplet 204 according to an embodiment of the present disclosure. According to the illustrated embodiment, the core IC 202 generates 1.8V external chiplet output 504 and input 510 enable signals, and forwards them 512, 514 to the chiplet 204. The core IC 202 also communicates with the chiplet 204 via a bidirectional 1.8V data connection 506 that is switched between output and input signaling by a direction control signal 518. Note that the VLSI input 502 from the chiplet 204 is always active, but is ignored by the core IC 202 when the bidirectional link 506 is transmitting data to the chiplet 204.

The chiplet 204 includes pairs of 1.8V and 3.3V devices that up-shift and down-shift data pulses between the 1.8V core IC standard and the 3.3V PCI standard, so that compatible 3.3V PCI signals can be output 520 to the PCI backpanel. The chiplet 204 uses the two enable inputs 512, 514 to control the direction of the data flow between the core IC 202 and the chiplet 204. The core IC has been modified so as to provide separate output enable 512 and input enable 514 control signals, which are not available on standard transceiver components, and which are critical to allowing the transceiver chiplet 204 to change the direction of the I/O bus 506 fast enough to maintain compliance with the PCI protocol standard. Due to the lack of adequate control signals and inability to meet performance requirements for directional control of the PCI protocol, using standard transceiver components to address either voltage incompatibility or cold spare tolerance issues when interfacing with advanced IC technology is impractical.

Example 2: Cold Spare Capable Flash Interfacing

Figure 6A:
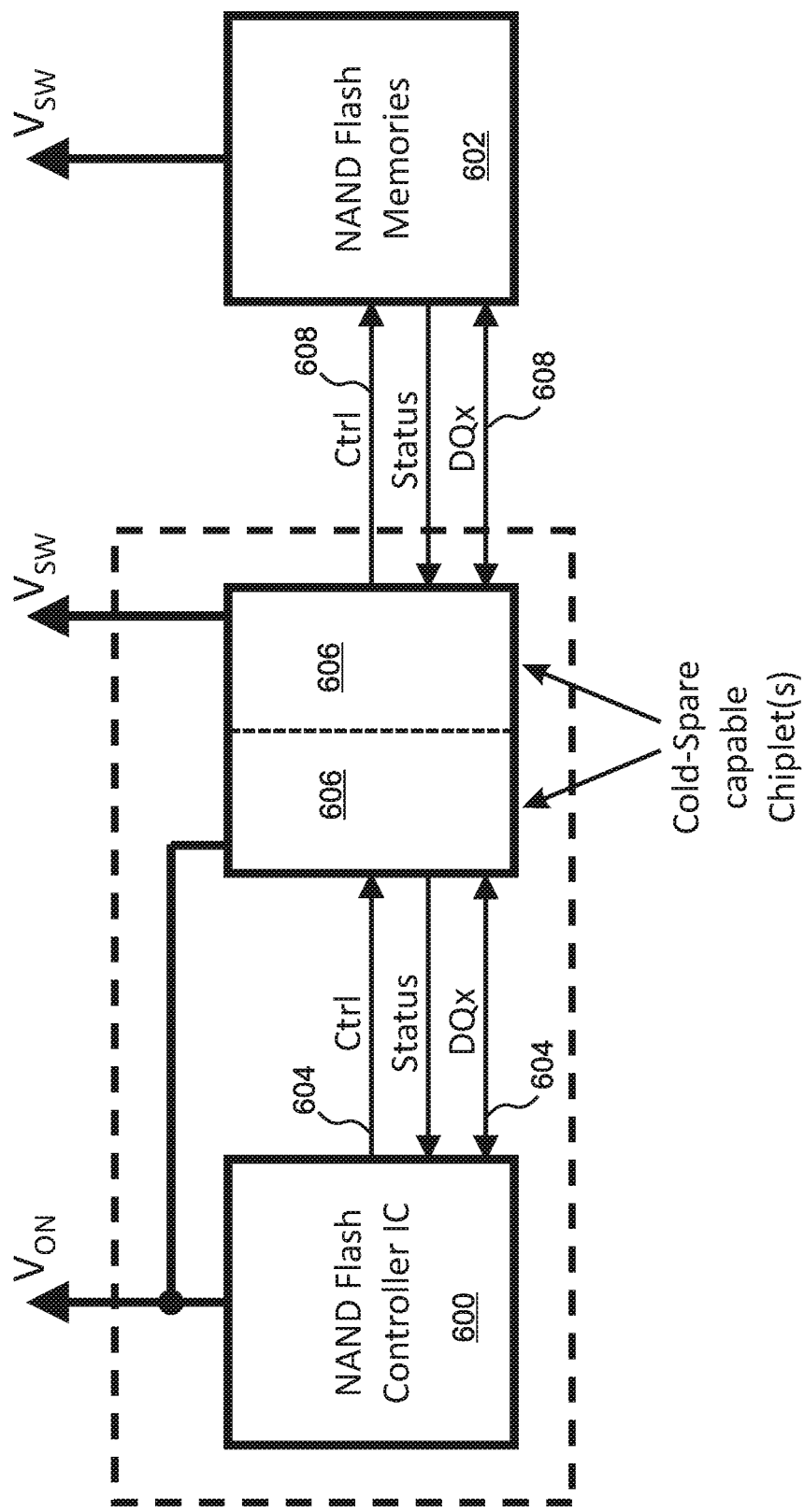
FIG. 6A is a circuit diagram of an embodiment of the present disclosure that provides cold spare functionality to a NAND FLASH controlling microcircuit.

According to the present disclosure chiplets can be used to interface a controlling microcircuit to powered on/off controllable non-volatile memory devices. With reference to FIG. 6A, an example of this concept is a NAND Flash controlling microcircuit 600 that remains powered at all times, attached to NAND Flash memories 602 that can be powered on or off. In the example of FIG. 6A, the NAND Flash controller outputs 604 must be configured so that none of them will drive a logic high into the unpowered NAND Flash memories 602. However, the NAND Flash controller outputs 604 cannot just be set to drive low prior to removing power to the NAND Flash memories 602, since some of the NAND Flash control inputs are active low. Another concern is that the NAND Flash controller inputs must be provided with known valid logic levels while the NAND Flash memories 602 are unpowered. Those inputs cannot "float" to intermediate voltages.

One solution to this interface issue is to insert cold spare capable chiplet technology 606 between the NAND Flash controlling microcircuit 600 and the NAND Flash memories 602. In this case, the chiplet interface 604 to the NAND Flash controlling microcircuit 600 can remain powered and feeding valid voltage levels to the controller 600, while power (Vsw) to the NAND Flash device 602 and the chiplet interface 608 to the NAND Flash device 602 can be switched off. In this example, the cold spare interface is provided within the chiplet.

Figure 6B:
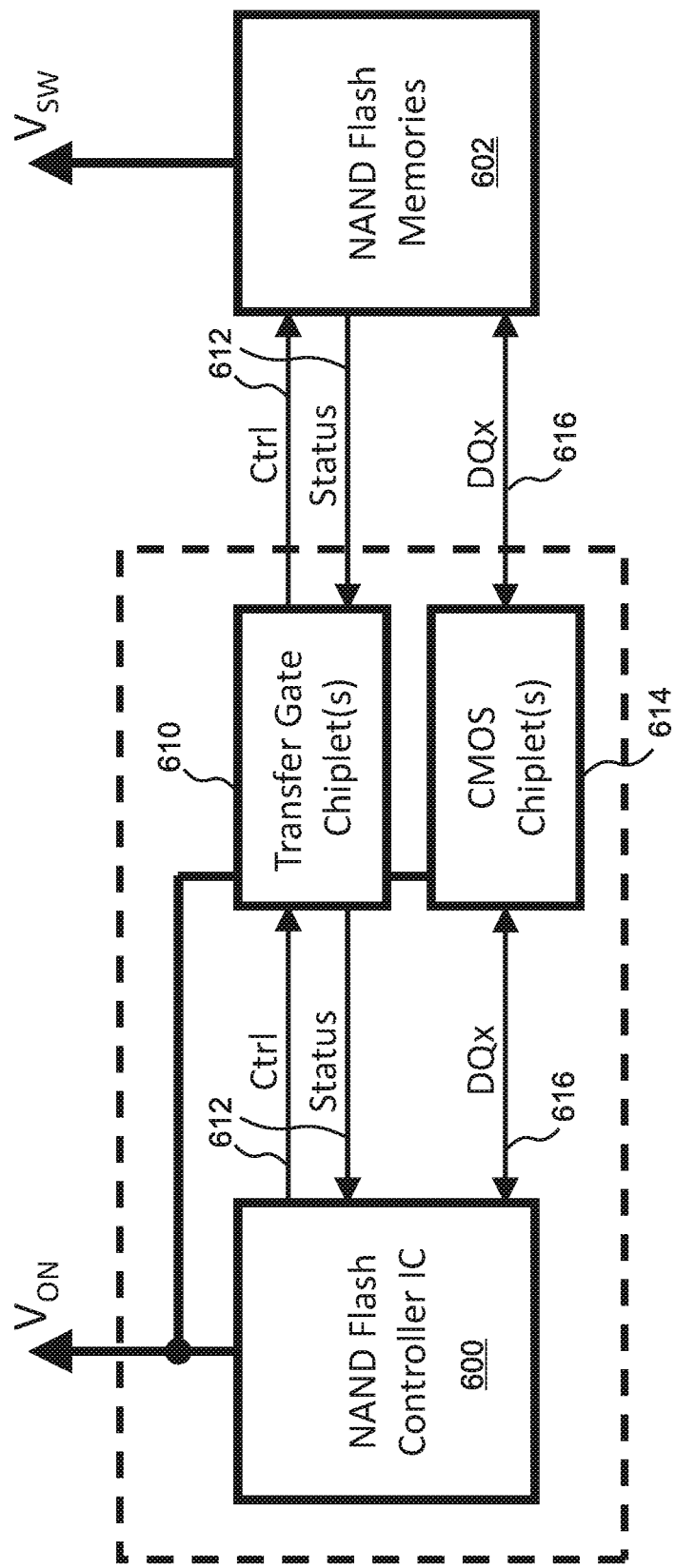
FIG. 6B is a circuit diagram that is an alternative to the circuit of FIG. 6A.

Another solution to this interface issue is illustrated in FIG. 6B. According to this example, always-powered transfer gate chiplet technology 610 is inserted on the control and status signals 612 between the NAND Flash controlling microcircuit 600 and the NAND Flash memories 602. In this case, the transfer gate 610 is opened when the NAND Flash memories 602 are powered off and board level NAND Flash controlling microcircuit soft-resistors (not shown) are used to hold the incoming status signals at valid logic levels. Additionally, always-powered Bidirectional CMOS chiplet technology 614 is inserted on the DQ signals 616 between the NAND Flash controlling microcircuit 600 and the NAND Flash memories 602 and are set to drive low when the NAND Flash memories 602 are powered off.

Example 3: SpaceVPX

The chiplets disclosed herein can be helpful in creating standardized spacecraft electronics, and can be applied for example to SpaceVPX, which is an electrical module and internal box standard designated by ANSI/VITA 78.00-

Figure 6C:
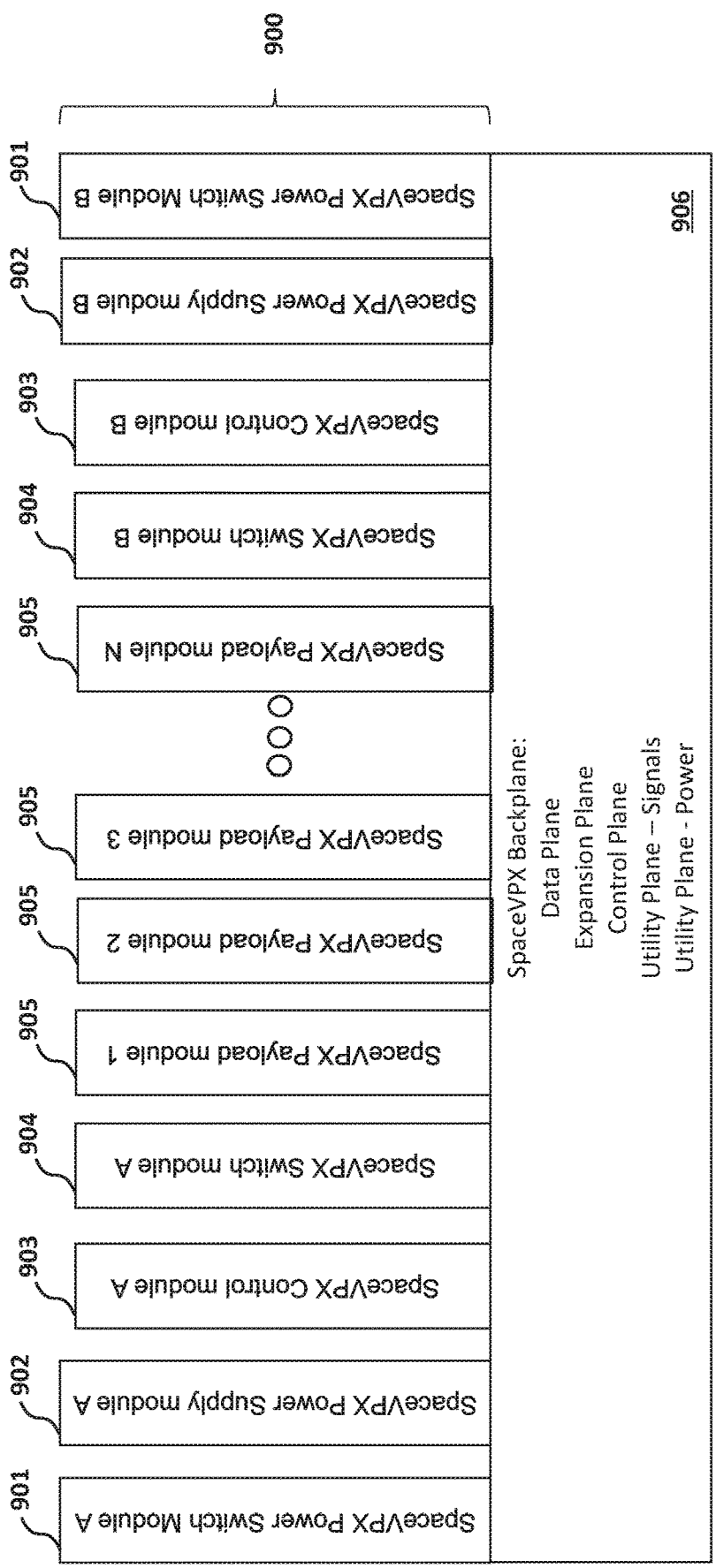
FIG. 6C illustrates a cold spare compliant SpaceVPX backplane in which embodiments of the present disclosure can be implemented.

2015. Referring to FIG. 6C, a SpaceVPX system is made up of multiple circuit card assembly modules (900) attached to a backplane (906). A typical SpaceVPX system is designed for single point fault tolerance and thus contains at least two of any module type (A and B). The system illustrated in FIG. 6C includes two Power Switch Modules (901), two Power Supply Modules (902), two System Controllers (903), two Switch Modules (904) and at least two Payload modules (905). Payload modules represent the user's mission, and may be realized as peripheral modules, additional switch modules, and/or heritage modules.

A SpaceVPX system is joined together by several fabrics wired between modules in the backplane 906. These include the data plane, expansion plane, control plane, utility plane—signals, and the utility plane for power. Because of the potential for SpaceVPX modules to be powered off for power or reliability reasons, the cold spare features of the chiplets disclosed herein can be especially helpful in making the fabrics realizable with modern sub-100 nm technologies.

Figure 6D:
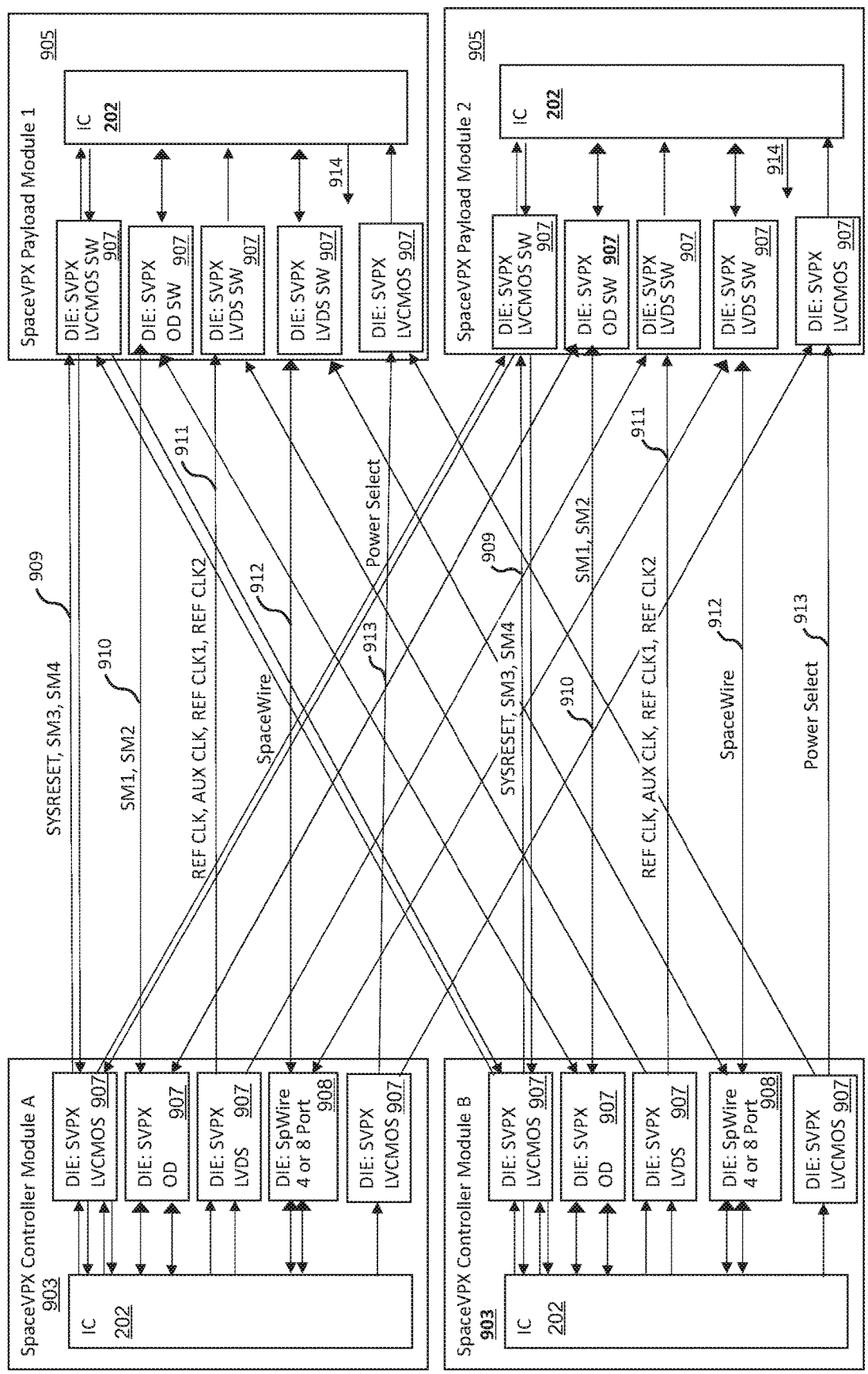
FIG. 6D illustrates interconnections between the modules of the SpaceVPX backplane of FIG. 6C.

An example of the critical signals in the utility plane-signals and the control plane is shown in FIG. 6D. SpaceVPX Controller modules 903 are the "brains" controlling the SpaceVPX box, and are responsible for handling all redundancy decisions within the system. In FIG. 6D, the dual SpaceVPX Controllers 903 and their connections to two example SpaceVPX Payload Modules 905 are shown. A core IC 202 is shown as a representative device to control this module. Two different chiplet dies are used on the controller, the SpaceVPX Companion chiplet 907 and the SpaceWire 4 or 8 port buffer chiplet 908. Two or more copies of all of the interfaces are generated by the core IC 202 and distributed by the chiplets 907 and 908. The SpaceVPX chiplets 907 in this example are used in three different modes (LVCMOS, OD and LVDS) to match the required utility plane signal types, which are the LVCMOS discretes, SYSRESET, SM3 and SM4 (909), the Open Drain (OD) busses SM1 and SM2 (910), the four LVDS clock signals (911) and a control plane SpaceWire interface (912).

The SpaceWire interfaces are re-driven by the SpaceWire 4 or 8 port chiplet 908. One copy of each is routed to each SpaceVPX Payload Module 905. These are received by four more SpaceVPX chiplets 907 and one SpaceWire 4 or 8 port buffer chiplet 908 that are configured to receive and select between A and B sources based on selection codes 913 compiled from both controllers and routed 914 to each chiplet. According to the embodiment, the Utility plane signal switches can be either present on the Payload Modules 905 or on the Power Switch Modules 906 as an extension of the Payload Modules. When present on a Power Switch Module, the Utility Signal Switches transform the Power Switch Module into a Space Utility Management Module. In embodiments, the Payload Modules 905 include SpaceWire switches within the SpaceWire 4 or 8 port chiplet 908. In other embodiments the Payload Modules 905 include the SpaceWire switches in the core IC 202. Both groups of embodiments utilize the cold spare capability of the SpaceWire 4 or 8 port chiplet 908.

Figure 7:
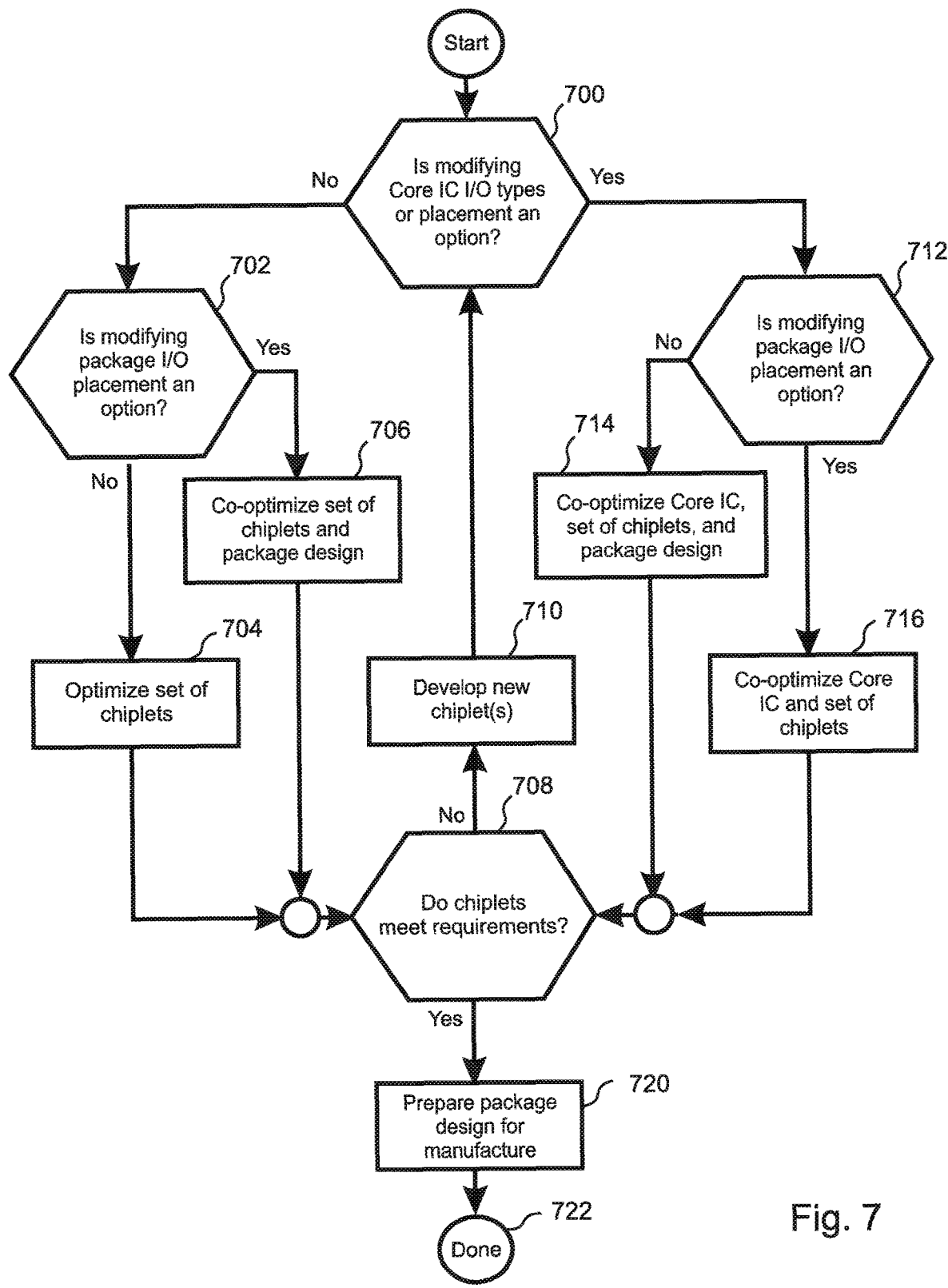
FIG. 7 is a flow diagram that illustrates a method embodiment of the present disclosure.

FIG. 7 is a flow diagram that illustrates a decision tree process that is applied in embodiments for designing a device 200 to meet new requirements. According to the illustrated process, an important first decision 700 is whether the core IC I/O type(s) and/or I/O placement can be modified to aid in meeting requirements. If, for example, the core IC is under development and modifications are permissible, this flexibility can aid in optimizing the solution. However, if the core IC is an existing component, modifications may not be practical.

If core IC modifications are not desired or not allowed, the next step 702 is to determine if I/O placement on the target multi-chip package (MCM-HIC) can be modified to optimize the solution. If I/O placement on the multi-chip package cannot be modified, the existing set of chiplets is analyzed to select the optimum 704 subset of chiplets that best meet the requirements considering factors such as:
   a. The core IC interface type(s), and locations;
   b. Target interface type(s) and locations at the multi-chip module level (including consideration of design constraints at the next higher level of assembly, e.g. a circuit card);
   c. Number and cost of chiplets;
   d. Required multi-chip module layout, wiring layers, size, thermal management and mass;
   e. Performance;
   f. power consumption; and
   g. Recurring and non-recurring cost and schedule.

On the other hand, if I/O placement on the MCM-HIC can be modified, a similar design optimization is performed 706 with the additional flexibility of modifying the MCM-HIC I/O placement to simplify the resulting design, reduce cost, and/or obtain other benefits. For example, the number of wiring layers needed in the package may be reduced by co-optimizing placement of the core IC, chiplets and MCM-HIC I/O.

Following the optimization step 704 or 706, the resulting solution is analyzed 708 to determine if the overall solution is satisfactory. If satisfactory, the overall MCM-HIC package design is completed and prepared for manufacturing 720. If not fully satisfactory, new chiplet(s) can optionally be designed 710. Such chiplet designs may incorporate a different number of I/O, new I/O locations, and/or new I/O types or features, such as power islands to accommodate power sequencing or lower system power.

Following step 710, step 700 is revisited, allowing a reconsideration of the core IC I/O types and placement decision. From 700, the No branch leading to 702 and the discussion above can be revisited with the added flexibility provided by the new chiplet(s). Alternatively, the Yes branch leading to 712 may be selected, as described below.

Returning to the start of the flow diagram in FIG. 7, if modifying core IC I/O types or placement is an option 700, the next step 712 is to determine if I/O placement on the target multi-chip package (MCM-HIC) can be modified to optimize the solution. If I/O placement on the multi-chip package cannot be modified, the existing set of chiplets is analyzed to select the optimum 714 subset of chiplets that best meet the requirements, considering factors such as those listed above with reference to step 704. Here, there is additional flexibility to optimize the solution. For example, the core I/C interface types and voltage levels can be chosen according to the available chiplet interface types and voltage levels so as to minimize size and power, improve performance, minimize the number of chiplets, etc. according to application needs.

On the other hand, if I/O placement on the MCM-HIC can be modified, a similar design optimization is performed 716 with the additional flexibility of modifying the MCM-HIC I/O placement to simplify the resulting design, reduce cost or obtain other benefits. For example, the number of wiring layers needed in the package may be reduced by co-optimizing placement of the core IC, chiplets and MCM-HIC I/O.

Following the optimization step 714 or 716, the resulting solution is analyzed 708 to determine if the overall solution is satisfactory. If not fully satisfactory, new chiplet(s) can optionally be designed 710. The process then continues with step 700 and follows the steps described above until a satisfactory solution is chosen in step 708. The overall MCM-HIC package design is completed and prepared for manufacturing 720, thus completing the process 722.

It will be clear to one of skill in the art that much of the flexibility of the present disclosure arises from the variety of different capabilities and features that chiplets can provide to a given core IC. Accordingly, as new potential applications arise, a need to design one or more new chiplets 710 may arise. In embodiments of the present disclosure, the design of new chiplets is facilitated by including programmable chiplets among the plurality of available chiplets that can be selected when preparing a new device. The use of programmable chiplets can enable "new" chiplets to be defined by software or firmware, without need of designing new chiplet hardware.

As is known in the art, programmable I/O circuits can support a wide variety of voltage/current levels and I/O protocols. See for example U.S. Pat. No. 6,218,858, which is incorporated herein by reference for all purposes, which discloses programmable I/O supporting TTL, GTL, GTLP, LVPECL and LVDS. Other combinations are feasible and known in the art. Many field programmable gate arrays (FPGA's) provide programmable I/O integrated on the FPGA IC, but these often lack critical features such as cold spare operation or the ability to interface with higher voltage/current level standards.

Figure 8:
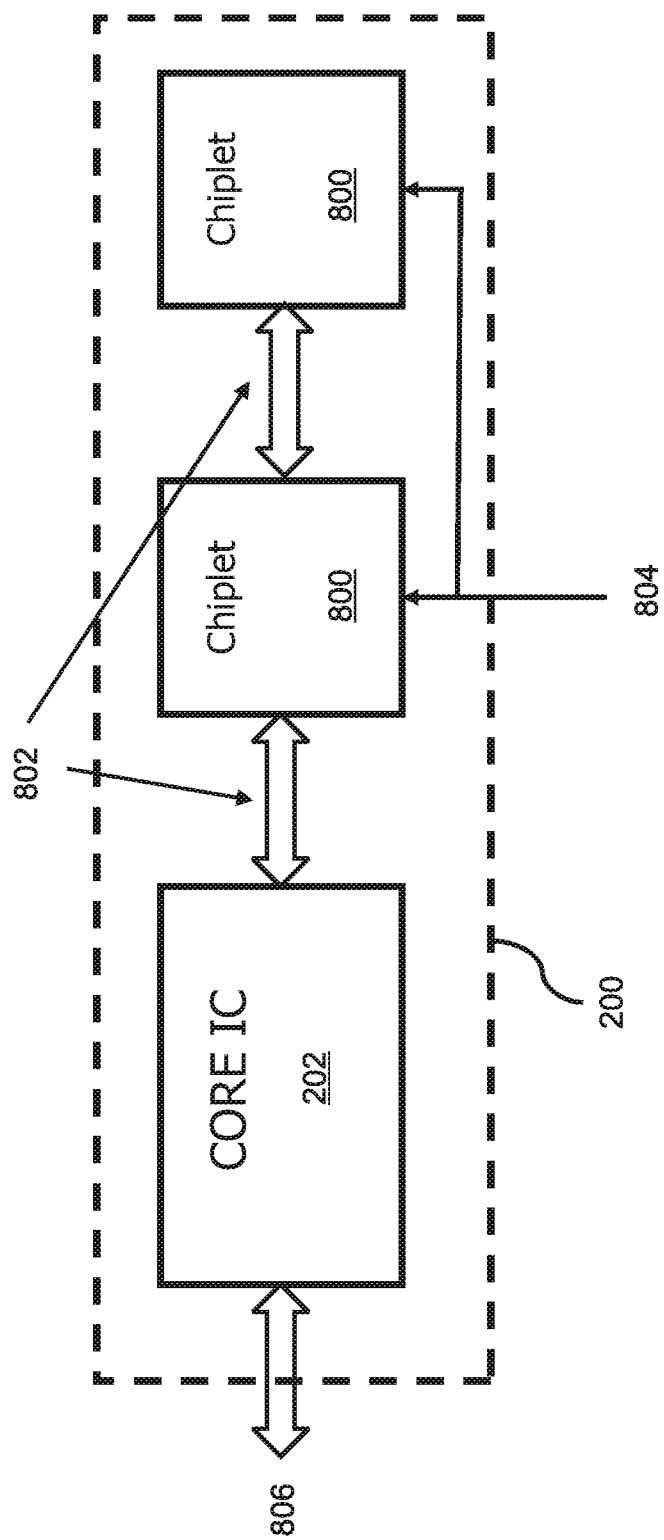
FIG. 8 is a block diagram illustrating an embodiment of the present disclosure that provides a programming interface for chiplets.

FIG. 8 is a block diagram that illustrates an embodiment wherein the MCM-HIC 200 includes a pair of programmable chiplets 800 that are interconnected with each other and with the core IC 202 by a programming interface 802 that is provided within the device 200. In various embodiments, methods of programming the programmable chiplets 800 can include:
  a) Mask programming at the time the chiplet hardware is manufactured;
  b) Application of Laser programming, eFuse programming, or other one-time programming methods such as antifuse;
  c) Non-volatile memory programming using reprogrammable (e.g. FLASH, SONOS, or ReRAM) memory elements;
  d) Volatile memory programming using embedded latches, flip-flops or RAM cells.

Methods in category a) support programming of the chiplets 800 prior to installation in the device 200. Methods in category b) support programming of the chiplets 800 prior to or after they are installed in the device 200, with limited or no re-configuration options. Methods in category c) support programming of the chiplets 800 either before or after they are installed in the device 200, with flexible re-programming capability. However, some embodiments in this category may permit only a limited number of reprogramming cycles. Whenever power is applied to the chiplet 800, methods in category d) support programming with maximum flexibility and virtually unlimited re-programming cycles, but the chiplet programming is lost when power is removed.

In various embodiments, the programming interface 802 that is used to write code to the programmable chiplets 800 can include:
  Direct laser programming of an I/O chiplet 800 while in the device 200, before any lid 304 or glob top is applied thereto;
  A programming interface 804 such as a high voltage interface wired directly from each I/O chiplet to pads and accessible on the device 200 only during manufacturing (e.g. on top of the substrate 210 or package lid 214). This approach is applicable to eFuse, antifuse, and non-volatile memory programming, among others, and can be useful for test programming during manufacturing of volatile memory based programmable chiplets 800.
  A programming interface 806 wired directly from each programmable chiplet 800 to the core IC 202, thereby allowing independent programming of each chiplet 800.
  A programming interface wired in a star, chain, ring or bi-directional ring that incorporates one or more programmable chiplets 800. The programming interface can be terminated at the core IC 202, by pads that are accessible during manufacturing, or via pads, pins, etc. that are accessible at the device by users.

Note that some programming technologies (e.g. Flash) may require high programming voltages or currents. In embodiments, wiring these to package pads or pins rather than to the VLSI IC simplifies the VLSI IC design and technology requirements.

Programming interface embodiments include:
  JTAG
  I²C
  SPI
  FPGA programming interface (e.g. Xilinx SelectMAP or similar interfaces from other FPGA vendors)
  Custom interface optimized for I/O chiplet programming technology.

In embodiments where programmable chiplets 800 are not included, or for an application that cannot be fully satisfied by existing chiplets 204 and/or programming of programmable chiplets 800, it can be necessary to design and manufacture new chiplet hardware. Development of new chiplet hardware can involve several considerations.

First, according to the embodiment, it may be necessary for the IC technology that is selected for a chiplet to include adequate support for a higher voltage external interface and a lower voltage interface used on the core IC. For example, 180 nm CMOS IC technology exists that provides adequate transistor breakdown voltage to support 3.3V cold spare circuits and adequate low voltage performance to support 1.8V interfaces to the core IC. This can allow a chiplet to support core ICs manufactured in <100 nm technology, down to at least 14 nm IC technology.

Second, the number and types of interfaces supported by a single chiplet die represent a tradeoff between die size, yield, flexibility, die per MCM-HIC package and cost.

Third, the use of standard footprints and IC technology in embodiments permits design and manufacturing efficiencies that significantly reduce cost by allowing chiplets to be produced in quantity and inventoried for later use as needed. For example, FIG. 9 shows a reticle layout supporting 52 chiplets of varying functionality, indicated as "I," "A," "B," "C," etc. and distributed over four standard footprints, as illustrated by the indicated height and width dimensions (in mm).

Figure 9:
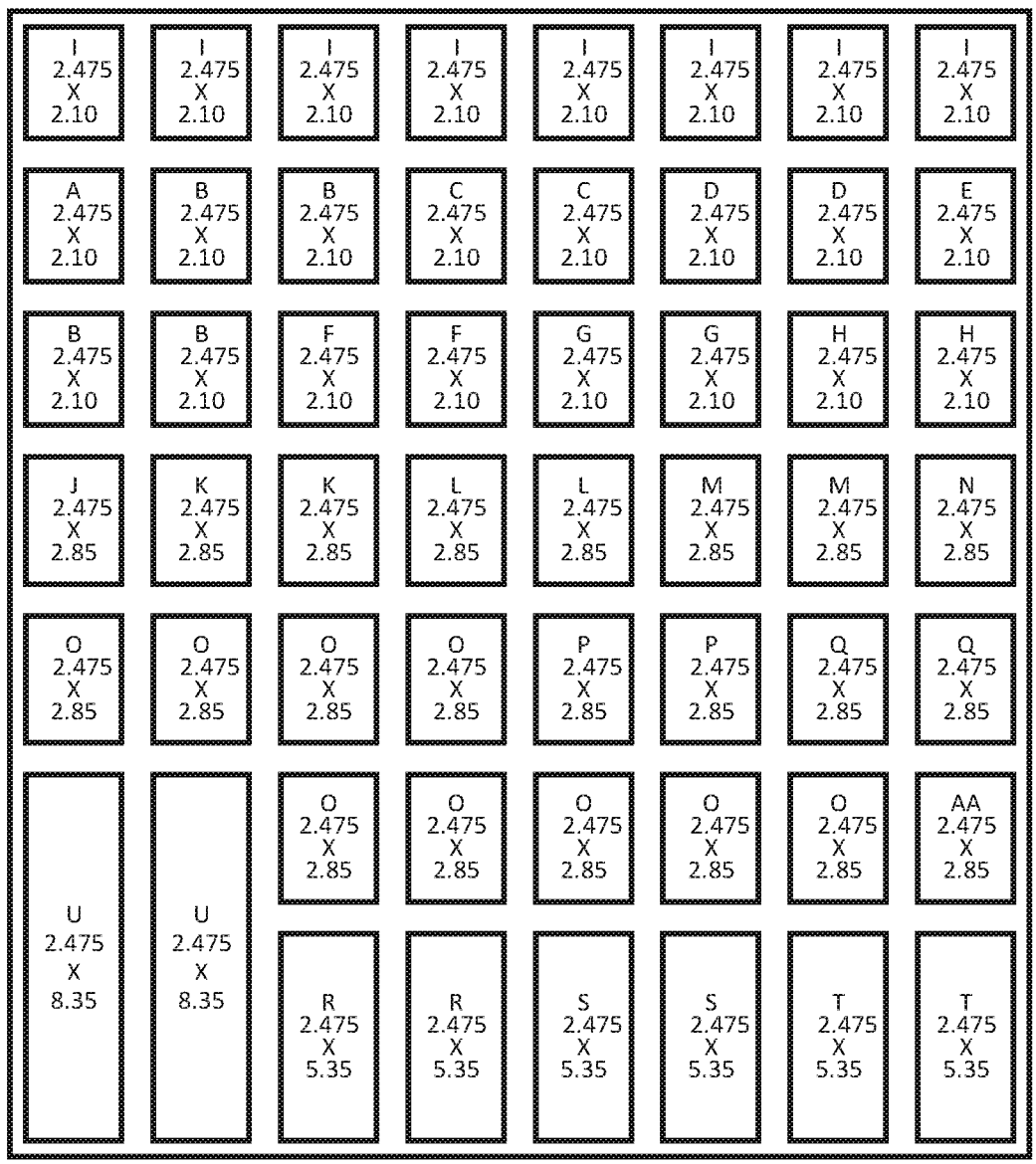
FIG. 9 illustrates an example of a reticle used to produce chiplets in embodiments of the present disclosure.
Figure 10:
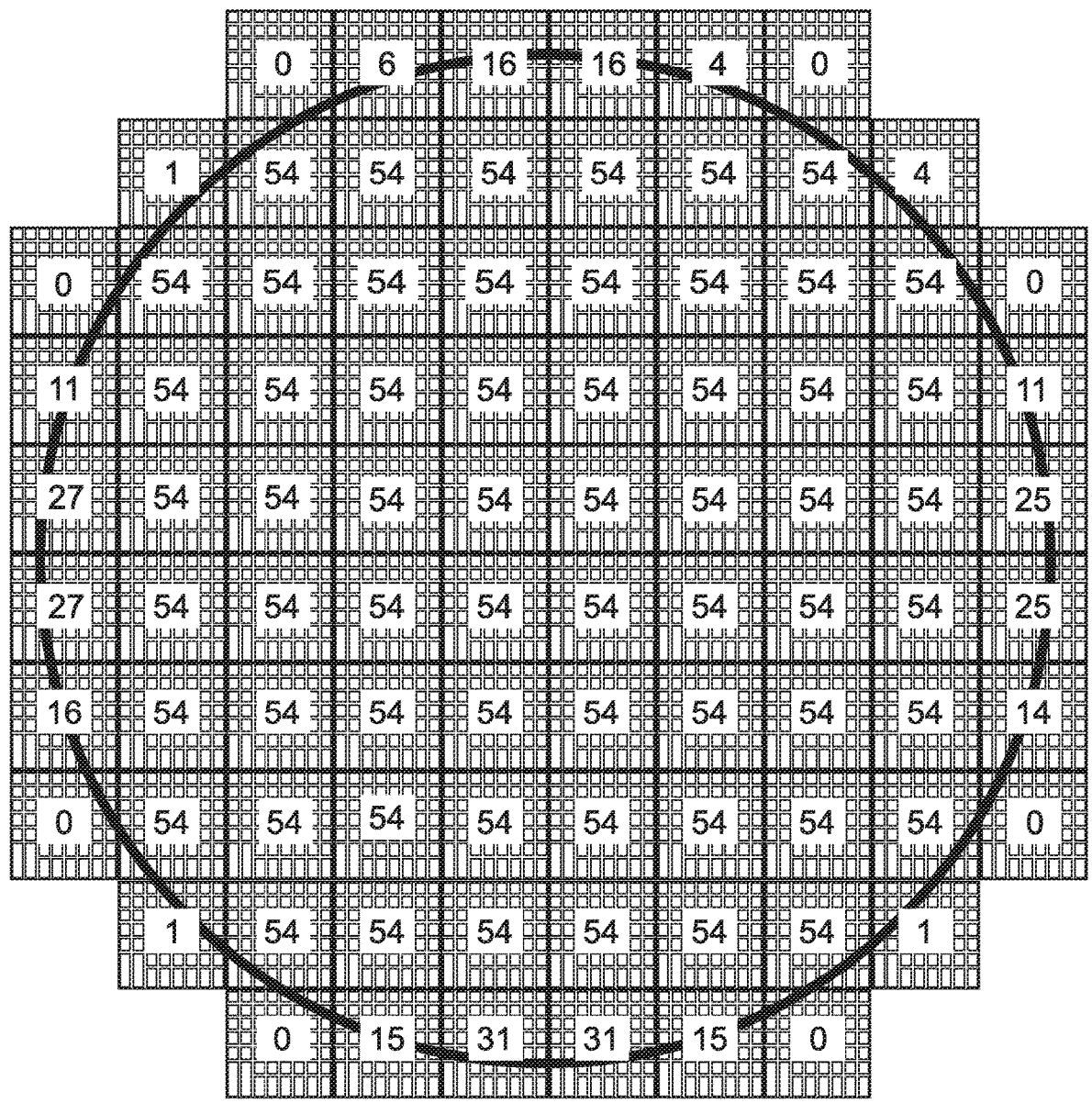
FIG. 10 illustrates a layout of the reticles of FIG. 9 on a silicon wafer in preparation for producing chiplets according to the present disclosure.

FIG. 10 illustrates a wafer map for this reticle, wherein a plurality of adjacent, identical reticles as illustrated in FIG. 9 are laid out as they will be printed on a circular wafer (indicated by the solid circle in the figure). In FIG. 10, the number of chiplets produced by each reticle is indicated by a number shown in the center of the reticle. For the majority of the reticles all 52 chiplets of the reticle are produced by the wafer. In addition, note that a subset of the 52 chiplets are produced even for many of the reticles that overlap the circular boundary of the wafer. FIGS. 9 and 10 illustrate that various transceiver types can be manufactured in quantity by a single wafer run, thereby enabling cost effective support of the low quantity requirements that are typical of space applications and many other niche and special purpose requirements.

In general, chiplet designs tend to fall into either of two categories: common IC electrical signaling format solutions and functional interface-specific solutions. In embodiments, the group of pre-defined chiplet designs from which chiplets can be selected 702 includes common IC electrical signaling format solution designs that address a wide range of signaling types, such as CMOS (JEDEC JESD8C.01, JEDEC JESD8-7A), LVDS (TIA/EIA-644) and open drain ($I^2C$). These designs are applicable to many situations, and as such they frequently can be used in a new device without modification.

On the other hand, functional interface-specific chiplet solutions are typically designed 716 to address challenges that cannot be readily solved using "standard" chiplet designs. For example, one of the major challenges related to the PCI communication standard (outside of the very high I/O count) is that the address/data bus is relatively high speed and operates in a bidirectional nature. Accordingly, it can be desirable to modify both a core IC and at least one chiplet when configuring a device 200 for interoperability between the VLSI core IC and a standard PCI bus to provide adequate control of the bidirectional bus.

Notably, the cost of adding chiplet support to a custom core IC production run in embodiments can be relatively low, because often the customized features are limited to modest changes in details of the design, such as adding additional logic outputs, that do not change the number of production steps, resolution, or any other aspects of the production process. Furthermore, in many cases the customized changes do not interfere with the normal operation or use of the chip or significantly change its physical configuration, power consumption, or other features, such that any excess production of the custom IC's can be absorbed by other applications that do not require the customized features but are also not adversely affected by them.

The disclosed method thereby allows a MCM-HIC to be readily and flexibly configured and manufactured for a specific application in a cost-effective manner, even where the required quantities are modest or low.

In embodiments, at least one of the core IC and chiplets is a "flip-chip" having connection points provided on its top surface and configured for inverted mounting in the package. In embodiments, the core IC(s) and/or chiplets are radiation hardened, and/or a surrounding wall and lid are configured to enclose and protect the components from radiation. Various embodiments include electrostatic discharge (ESD) mitigation, and/or support cold spare operation.

While the presently disclosed device is sometimes described herein as including "a" core IC, it will be clear to one of skill in the art that the disclosure can be readily extended to devices that incorporate a plurality of core IC's, such that such multi-core-IC embodiments are within the scope of the present disclosure. Furthermore, it will be clear to one of skill in the art that the present disclosure includes embodiments where there is no difference between the voltage levels of the core IC(s), and where chiplet(s) nevertheless function for example to provide signal conversions and/or control signals required for interoperability between different interface types, to provide cold spare capability, and/or to provide other required functionality, as will be readily understood by one of skill in the art.

Also, while the disclosed device is sometimes described herein as having a package, "cavity," or "compartment" within which the core IC(s) and chiplet(s) are mounted, other mounting configurations are included within the scope of the present disclosure, including configurations that do not include a surrounding wall or lid, such as packages having a flat interconnecting substrate presenting a mounting surface with exposed dies, as well as configurations with "glob top" encapsulation: i.e. where the components are covered by a protective material such as an epoxy, with or without a surrounding wall.

Furthermore, while the disclosed device is described herein as having columns, pins, or pads on a bottom surface of the interconnecting substrate or package bottom that are configured for connecting to an underlying circuit board, other types of I/O connection are included within the scope of the present disclosure, such as cables extending from the device that terminate in wired single or multi-pin connectors.

The foregoing description of the embodiments of the present disclosure has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the disclosure to the precise form disclosed. Many modifications and variations are possible in light of this disclosure.

Although the present application is shown in a limited number of forms, the scope of the present disclosure is not limited to just these forms, but is amenable to various changes and modifications without departing from the spirit thereof. The disclosure presented herein does not explicitly disclose all possible combinations of features that fall within the scope of the present disclosure. The features disclosed herein for the various embodiments can generally be interchanged and combined into any combinations that are not self-contradictory without departing from the scope of the present disclosure. In particular, the limitations presented in dependent claims below can be combined with their corresponding independent claims in any number and in any order without departing from the scope of this disclosure, unless the dependent claims are logically incompatible with each other.

What is claimed is:

1. A multi-chip module hybrid integrated circuit, comprising:
   an interconnecting substrate;
   at least one VLSI core integrated circuit ("IC") installed on the interconnecting substrate, wherein the at least one VLSI core IC has input/output interfaces that support at least one of low voltage or low current;
   at least one chiplet installed on the interconnecting substrate, the at least one chiplet being an active chiplet that comprises at least one active circuit, a mixed chiplet that comprises at least one active circuit and at least one passive circuit, or a passive chiplet that comprises at least 40 passive components, not including interconnections therebetween;
   a plurality of output connections configured to provide intercommunication between a device and at least one external device; and wherein the interconnecting substrate provides interconnection between the at least one VLSI core IC and the at least one chiplet;

wherein the at least one chiplet implements at least one enhanced feature that is not implemented in the at least one VLSI core IC;

wherein the at least one enhanced feature includes enabling intercommunication between the at least one VLSI core IC and at least one external device using at least one of signal voltages, control voltages, and output currents that are too high for the at least one VLSI core IC to produce and/or tolerate.

2. The circuit of claim 1, wherein the at least one enhanced feature includes enabling intercommunication between the at least one VLSI core IC and the at least one external device using a communication protocol that is not supported by the at least one VLSI core IC.

3. The circuit of claim 2, wherein the at least one chiplet enables intercommunication between the at least one VLSI core IC and the at least one external device using a plurality of communication protocols that are not directly supported by the at least one VLSI core IC.

4. The circuit of claim 1, wherein the at least one enhanced feature includes enabling intercommunication between the at least one VLSI core IC and the at least one external device using control signals that the at least one VLSI core IC cannot produce.

5. The circuit of claim 1, wherein the at least one enhanced feature includes support of cold spare operation of the multi-chip module hybrid integrated circuit.

6. The circuit of claim 1, wherein the at least one enhanced feature includes power gating of the at least one VLSI core IC, wherein power is supplied to the at least one VLSI core IC when operation of the at least one VLSI core IC is required.

7. The circuit of claim 1, wherein the at least one chiplet has input/output (I/O) signals comprising one or more of an input/output (I/O) voltage, current, or interface type that are programmable.

8. The circuit of claim 7, wherein the I/O signals use a permanent programming method that includes at least one of:
mask programming during manufacture of the programmable chiplet;
laser programming;
eFuse programming; and
antifuse programming.

9. The circuit of claim 7, wherein the at least one chiplet includes at least one of non-volatile and volatile memory that is able to accept and store I/O configuration instructions for execution by the at least one chiplet.

10. The circuit of claim 7, further comprising a user-accessible programming interface that provides programming access for a user to transfer I/O configuration instructions to the at least one chiplet after it has been installed in the circuit.

11. The circuit of claim 1, wherein the at least one VLSI core IC and the at least one chiplet are hermetically sealed within a compartment included in the multi-chip module hybrid integrated circuit.

12. The circuit of claim 1, wherein the circuit includes at least one of radiation hardening and electrostatic discharge (ESD) mitigation.

13. The circuit of claim 1, wherein the interconnecting substrate comprises a primary region and an interposer region, and wherein the regions differ from each other in at least one of interconnection density and interconnection current capacity.

14. The circuit of claim 13, wherein an upper surface of the interposer region is level with an upper surface of the primary region, and wherein at least one of the at least one chiplet overlaps a boundary between the primary and interposer regions of the interconnecting substrate, so that direct interconnections are formed between the overlapping chiplet and the primary region, and between the overlapping chiplet and the interposer region.

15. A kit for producing a multi-chip module hybrid integrated circuit, the kit comprising:
an interconnecting substrate;
at least one VLSI core integrated circuit ("IC") that is compatible for installation on the interconnecting substrate; and
a plurality of chiplets compatible for installation on the interconnecting substrate on at least one chiplet-compatible chip site provided on said interconnecting substrate, wherein the plurality of chiplets includes at least one of an active chiplet that comprises at least one active circuit, a mixed chiplet that comprises at least one active circuit and at least one passive circuit, and a passive chiplet that comprises at least 40 passive components, not including interconnections therebetween;
wherein the interconnecting substrate provides interconnection between the at least one VLSI core IC and the at least one chiplet-compatible chip site;
wherein, for each of a plurality of enhanced features that are not supported by the at least one VLSI core IC, a group of one or more of the plurality of chiplets are installed on the interconnecting substrate so as to implement the enhanced feature;
wherein the plurality of enhanced features includes enabling intercommunication between the at least one VLSI core IC and at least one external device using at least one of signal voltages, control voltages, and output currents that are too high for the at least one VLSI core IC to produce and/or tolerate.

16. The kit of claim 15, wherein the kit comprises a plurality of core ICs that are installed on the interconnecting substrate.

17. The kit of claim 15, wherein the kit comprises a plurality of interconnecting substrates configured for interconnecting different core IC and chip site combinations.

18. The kit of claim 15, wherein the plurality of chiplets includes a group of one or more of the chiplets that are installed on said interconnecting substrate so as to enable intercommunication between the at least one VLSI core IC and at least one external device using a communication protocol that is not supported by the at least one VLSI core IC.

19. The kit of claim 15, wherein the plurality of chiplets includes a group of one or more of the chiplets that are installed on the interconnecting substrate so as to enable support of cold spare operation of the multi-chip module hybrid integrated circuit.

20. The kit of claim 15, wherein the plurality of chiplets includes a group of one or more of the chiplets that are installed on the interconnecting substrate so as to enable power gating of the at least one VLSI core IC, wherein power is supplied to the core IC when operation of the core IC is required.

21. The kit of claim 15, wherein the plurality of chiplets includes at least one programmable chiplet.

\* \* \* \* \*